(12) United States Patent
Soneda et al.

(10) Patent No.: US 9,318,857 B2
(45) Date of Patent: Apr. 19, 2016

(54) POWER STRIP AND ELECTRICAL POWER MEASUREMENT SYSTEM

(75) Inventors: Hiromitsu Soneda, Atsugi (JP); Osamu Tsuboi, Kawasaki (JP); Fumihiko Nakazawa, Koube (JP)

(73) Assignee: FUJITSU LIMITED, Kawasaki (JP)

( * ) Notice: Subject to any disclaimer, the term of this patent is extended or adjusted under 35 U.S.C. 154(b) by 569 days.

(21) Appl. No.: 13/589,413

(22) Filed: Aug. 20, 2012

(65) Prior Publication Data

US 2013/0045626 A1    Feb. 21, 2013

Related U.S. Application Data

(63) Continuation of application No. PCT/JP2011/058640, filed on Apr. 5, 2011.

(30) Foreign Application Priority Data

Jan. 20, 2011    (WO) .................. PCT/JP2011/050989

(51) Int. Cl.
*G01R 33/07*  (2006.01)
*G01R 11/02*  (2006.01)
(Continued)

(52) U.S. Cl.
CPC .............. *H01R 25/003* (2013.01); *G01R 33/07* (2013.01); *H01R 13/6683* (2013.01)

(58) Field of Classification Search
CPC .............. H04R 1/1041; H04R 1/1016; H04R 2201/107; H04R 1/1058; H04R 2420/07; H04R 2420/09; H04R 1/083; H04R 1/1066; H04R 1/1075; H04R 2225/023; H04R 2460/17; H04R 25/602; H04R 25/604; H04R 25/65; G01R 33/0005; G01R 33/0047; G01R 33/072; G01R 15/186; G01R 19/15; G01R 21/06; G01R 33/075; G01R 21/133; G01R 15/207; G01R 19/0092; G01R 22/06; G01R 31/024; G01R 31/041; G01R 33/07; H01R 13/6205; H01R 13/2428; H01R 13/7039; H01R 13/6683; H01R 13/6275; H01R 13/504; H01R 13/665; H01R 2103/00; H01R 24/48; H01R 13/72; H01R 24/547; H01R 29/00; H01R 2201/20; H01R 25/142; H01R 25/162; H01R 31/065; H01R 4/64; G01D 5/145; H01F 3/04

See application file for complete search history.

(56) References Cited

U.S. PATENT DOCUMENTS 5,721,934 A *  2/1998  Scheurich ...................... 713/320
7,626,796 B2 * 12/2009  Ramirez et al. .............. 361/93.1
(Continued)

FOREIGN PATENT DOCUMENTS

EP    1 710 591 A1    10/2006
JP    S63-110580       5/1988
(Continued)

OTHER PUBLICATIONS

International Search Report for International Application No. PCT/JP2011/058640 dated Jul. 12, 2011.
Supplementary European Search Report dated Jan. 5, 2015 in European Application No. 11856368.3.

*Primary Examiner* — Vinh Nguyen
(74) *Attorney, Agent, or Firm* — Kratz, Quintos & Hanson, LLP

(57) ABSTRACT

A power strip includes a casing including a plurality of plug insertion portions each having a first insertion port and a second insertion port into which first and second plug blades of a socket plug are to be respectively inserted, a magnetic core which is provided in each of the plurality of plug insertion portions and includes a first opening into which the first plug blade is to be inserted, a second opening into which the second plug blade is to be inserted, and a slit to communicate between the first plug blade and the second plug blade, and a magnetic sensor provided inside the slit.

21 Claims, 39 Drawing Sheets

(51) Int. Cl.
*H01R 25/00* (2006.01)
*H01R 13/66* (2006.01)

(56) References Cited

U.S. PATENT DOCUMENTS

| | | | |
|---|---|---|---|
| 7,745,954 B1* | 6/2010 | Menas | 307/38 |
| 2009/0079416 A1* | 3/2009 | Vinden et al. | 324/103 R |
| 2011/0187348 A1* | 8/2011 | Soneda | H01R 25/003 324/117 H |

FOREIGN PATENT DOCUMENTS

| | | |
|---|---|---|
| JP | H9-84146 | 3/1997 |
| JP | H9-189723 | 7/1997 |
| JP | H10-97879 | 4/1998 |
| JP | H11-108971 | 4/1999 |
| JP | H11-313441 | 11/1999 |
| JP | 2000-221218 | 8/2000 |
| JP | 2007-139728 | 6/2007 |
| JP | 2009-218121 | 9/2009 |

* cited by examiner

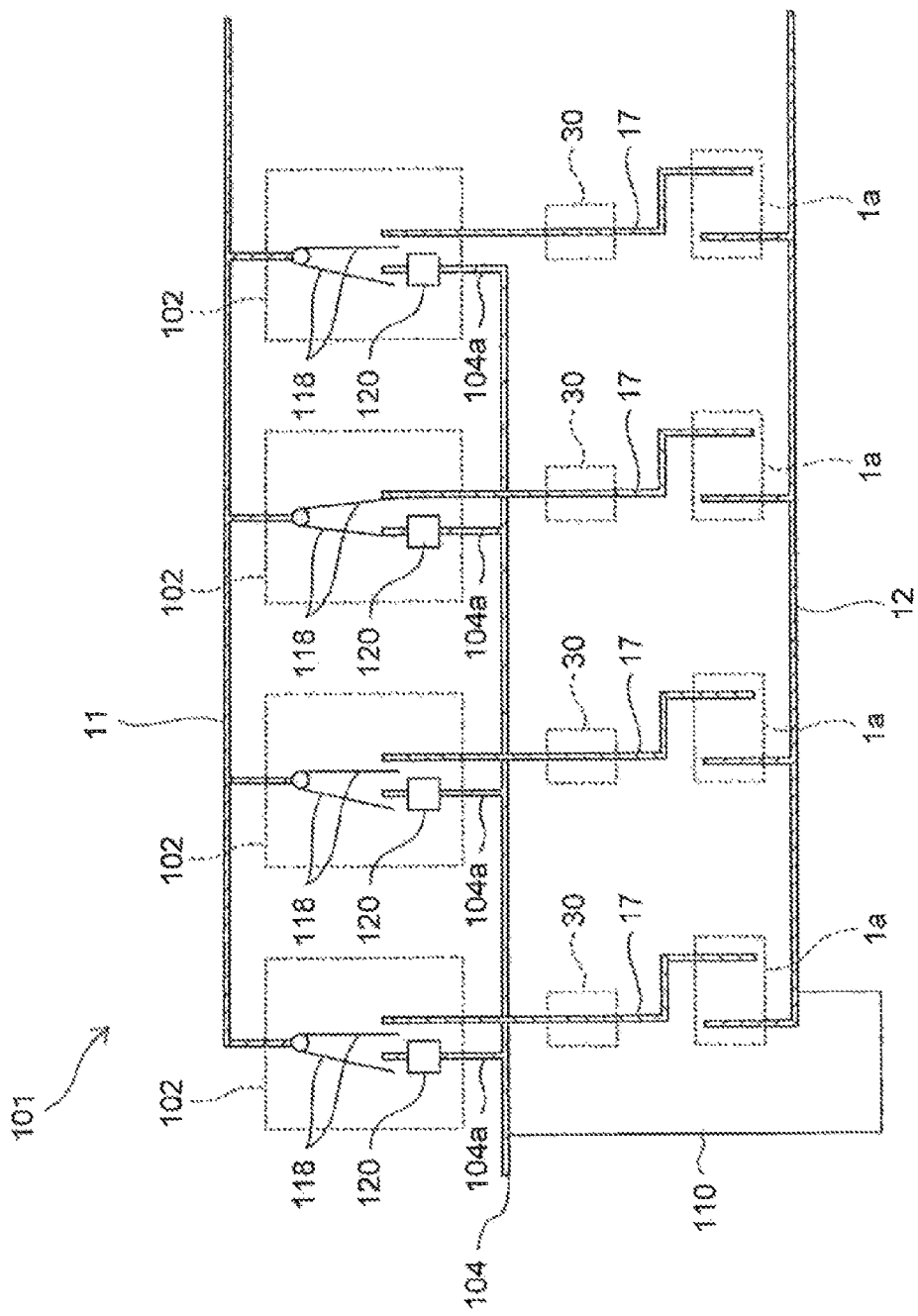

POWER STRIP AND ELECTRICAL POWER MEASUREMENT SYSTEM

CROSS-REFERENCE TO RELATED APPLICATION(S)

This application is continuation application of International Application PCT/JP2011/58640 filed on Apr. 5, 2011 and designated the U.S., the entire contents of which are incorporated by reference.

FIELD

It is related to a power strip and an electrical power measurement system.

BACKGROUND

Recently, with an increase in the electricity demand and the consciousness of the global environment, there has been a rising momentum in saving power consumption in households and offices. With such growing sense of saving energy, such efforts is made that electric devices are frequently turned off and a setting temperature of an air conditioner is readjusted.

Various methods of measuring power consumption are proposed to grasp how much energy is actually saved with these efforts.

However, it is difficult in any of these methods to accurately measure a power consumption of an individual electrical device.

For example, a method is proposed in which a terminal to measure power consumption is provided in a home socket so as to measure the current power consumption of an electrical device connected to the socket. However, in this method, in the case where a power strip is connected to one wall power and a plurality of electrical devices are connected to the power strip, there is a problem that only the total amount of the power consumptions of the electrical devices can be measured, and the power consumption of each electrical device cannot be individually measured.

Also, there is a method in which a current sensor for measuring power consumption is provided to a power wire before being branched by a home distribution board. However, in this method, it is impossible to see how much power is consumed by each power wire after being branched by the distribution board.

Technologies relating to the background arts are disclosed in JPA 9-84146, JPA 10-97879, JPA 11-108971, and JPA 11-313441.

SUMMARY

According to one aspect of the following disclosure, there is provided a power strip having a casing which includes a plurality of plug insertion portions each having a first insertion port and a second insertion port into which first plug blade and second plug blade of a socket plug are to be respectively inserted, a magnetic core which is provided to correspond with each of the plurality of plug insertion portions and includes a first opening into which the first plug blade is to be inserted, a second opening into which the second plug blade is to be inserted, and a slit by which the first opening and the second opening communicate, and a magnetic sensor provided in the slit.

According to another aspect of the following disclosure, there is provided an electrical power measurement system having a power strip including a plurality of plug insertion portions into which socket plugs of external electrical devices are to be respectively inserted, the power strip supplying a power-supply voltage to each of the plug insertion portions, a magnetic core provided in each of the plug insertion portions and having a slit, a magnetic sensor provided in the slit and measures a current flowing through a first plug blade and a second plug blade of the socket plug, and a program which calculates power consumptions of a plurality of electrical devices connected to the plug insertion portions, the power being calculated for each of the electrical devices by multiplying the measured current by the power-supply voltage, wherein the magnetic core has a first opening into which the first plug blade is to be inserted and a second opening into which the second plug blade is to be inserted, and the first opening and the second opening are communicating by the slit.

The object and advantages of the invention will be realized and attained by means of the elements and combinations particularly pointed out in the claims.

It is to be understood that both the forgoing general description and the following detailed description are exemplary and explanatory and are not restrictive of the invention.

BRIEF DESCRIPTION OF DRAWINGS

FIG. 39 is a circuit diagram of the power strip according to the eighth embodiment.

DESCRIPTION OF EMBODIMENTS

First Embodiment

Figure 1:
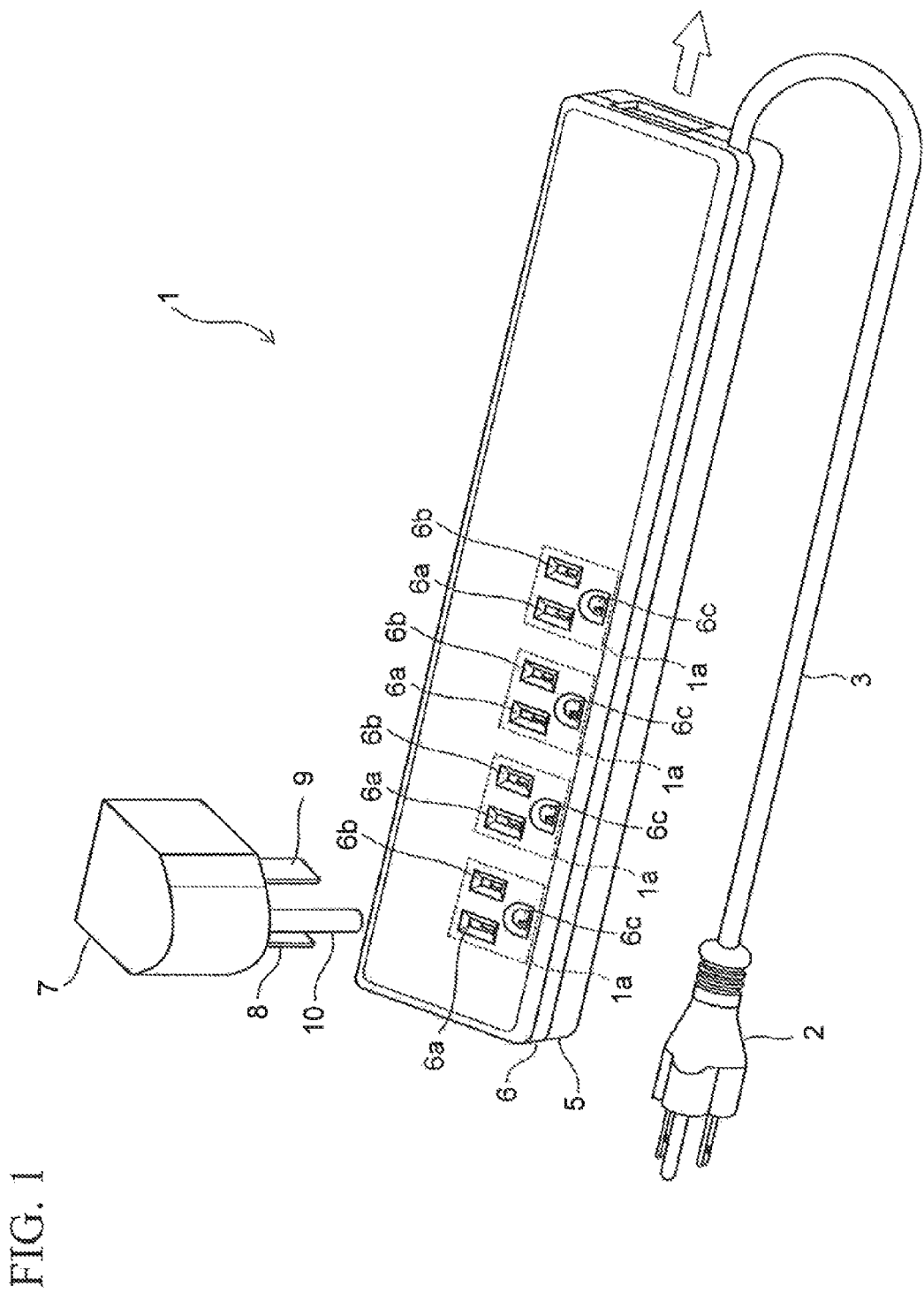
FIG. 1 is an external view of a power strip according to a first embodiment.

FIG. 1 is an external view of a power strip 1 according to this embodiment.

The power strip 1 includes a socket plug 2, a power cord 3, a lower casing 5, and an upper casing 6.

Among them, the upper casing 6 is provided with a plurality of plug insertion portions 1a corresponding to a socket plug 7. The socket plug 7 is provided to an external electrical device, and has a first plug blade 8, a second plug blade 9, and an earth terminal 10.

The plug insertion portions 1a includes a first insertion port 6a into which the first plug blade 8 is inserted, a second insertion port 6b into which the second plug blade 9 is inserted, and a third insertion port 6c into which the earth terminal 10 is inserted.

In the above-described power strip 1, when the socket plug 2 is inserted into a socket that is installed on the wall or the like, a voltage of an alternating-current power source of the installed plug socket is supplied to each plug insertion portion 1a via the power cord 3.

Figure 2:
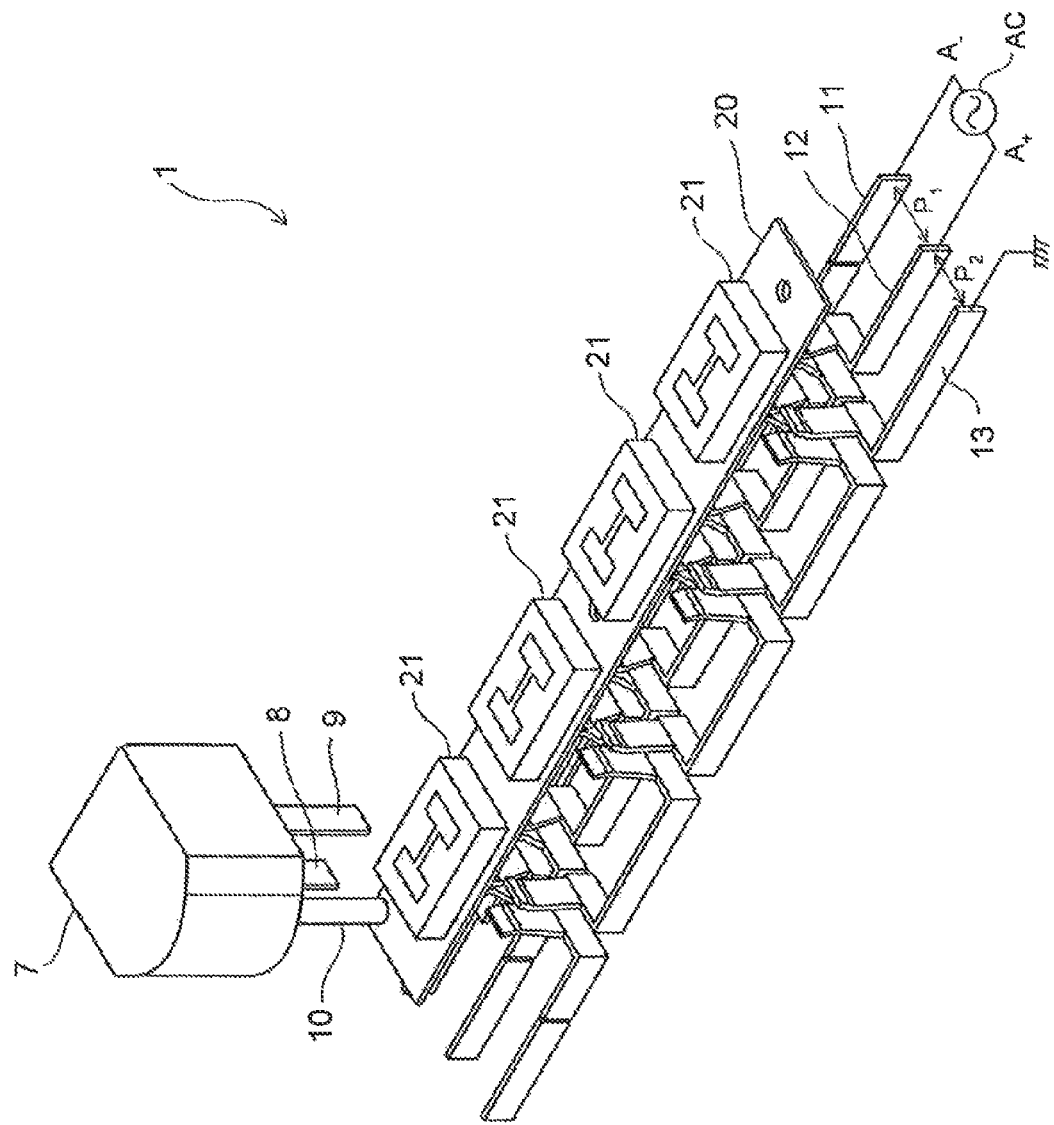
FIG. 2 is an external view of the power strip without a casing, according to the first embodiment.

FIG. 2 is an external view of the power strip 1 without the casings 5 and 6.

As illustrated in FIG. 2, the power strip 1 includes first to third bus bars 11 to 13 arranged with predetermined gaps $P_1$ and $P_2$ provided thereamong. These bus bars 11 to 13 are manufactured by cutting a metal plate such as brass plate, and then bending the metal plate.

Among these bus bars 11 to 13, the first bus bar 11 and the second bus bar 12 are respectively electrically connected to each poles $A_-$ and $A_+$ of the alternating-current power source AC on the wall or the like via the power cord 3 (see FIG. 1), whereas the third bus bar 13 is kept at an earth potential via the power cord 3.

Also, a first circuit board 20 is provided above the bus bars 11 to 13.

A plurality of magnetic cores 21 each corresponding to the socket plug 7 is provided on the first circuit board 20.

Figure 3:
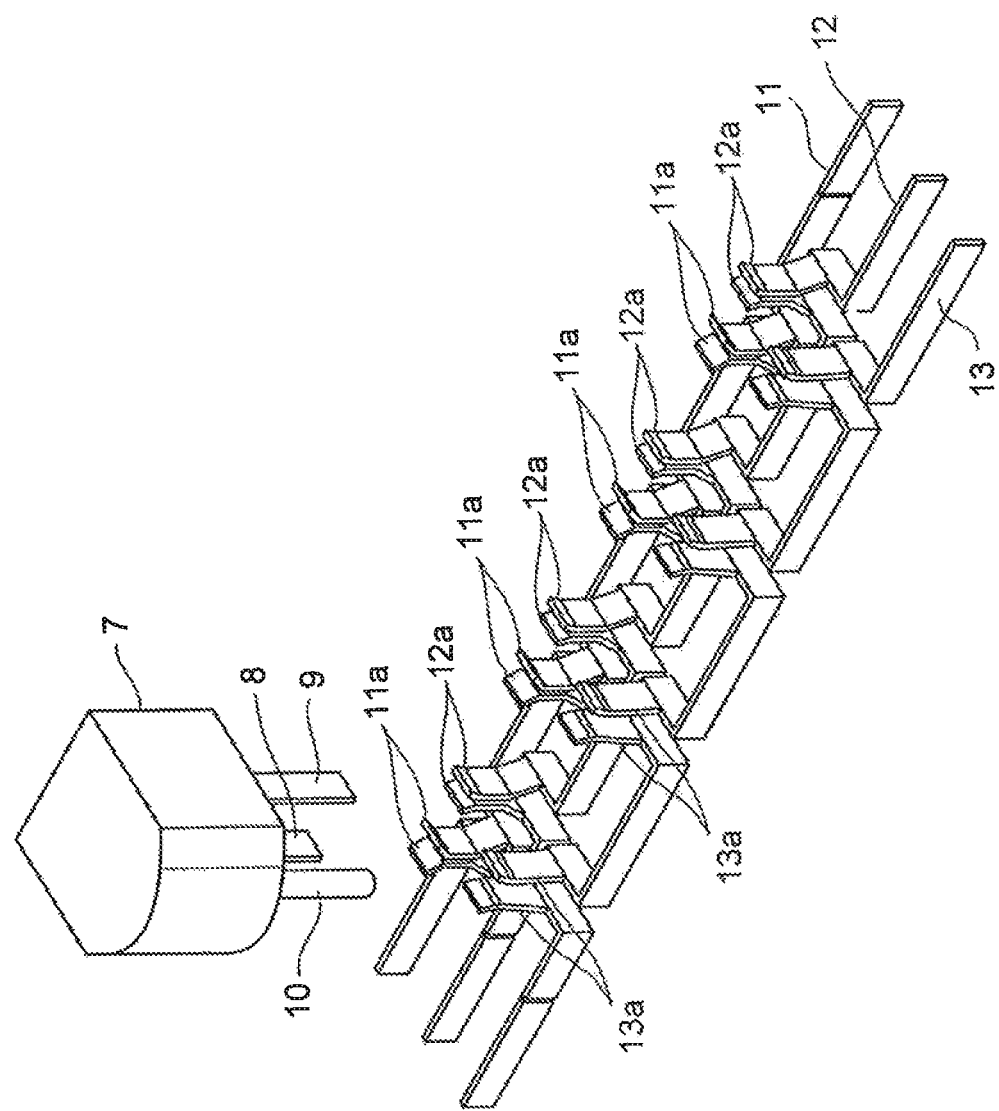
FIG. 3 is a perspective view illustrating an arrangement of each bus bar which is provided to the power strip according to the first embodiment.

FIG. 3 is a perspective view illustrating an arrangement of the bus bars 11 to 13.

As illustrated in FIG. 3, the first bus bar 11 has a plurality of first contacts 11a which receive the first plug blade 8. In addition, the second bus bar 12 has a plurality of second contacts 12a which receive the second plug blade 9.

Also, the third bus bar 13 has a plurality of third contacts 13s which receive the earth terminal 10.

Figure 4:
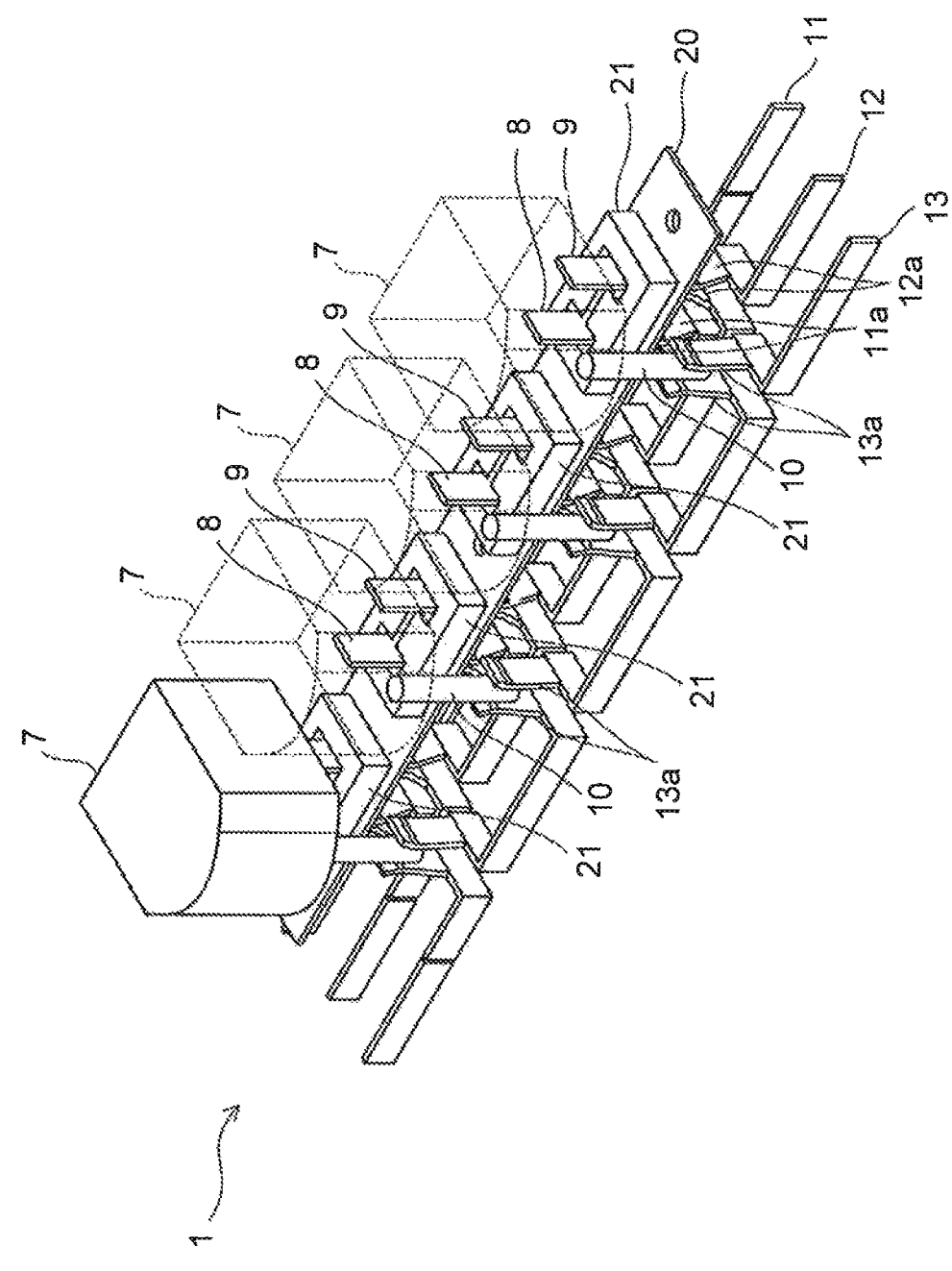
FIG. 4 is a perspective view illustrating a case where a plurality of socket plugs are inserted into the power strip according to the first embodiment.

FIG. 4 is a perspective view illustrating the case where a plurality of the socket plugs 7 are inserted into the power strip 1.

As illustrated in FIG. 4, the plug blades 8 and 9 of each socket plug 7 are inserted through the magnetic core 21. Then, the first plug blade 8 is in contact with the first contact 11a, and the second plug blade 9 is in contact with the second contact 12a.

The earth terminal 10 of the socket plug 7 is in contact with the third contact 13a.

Figure 5:
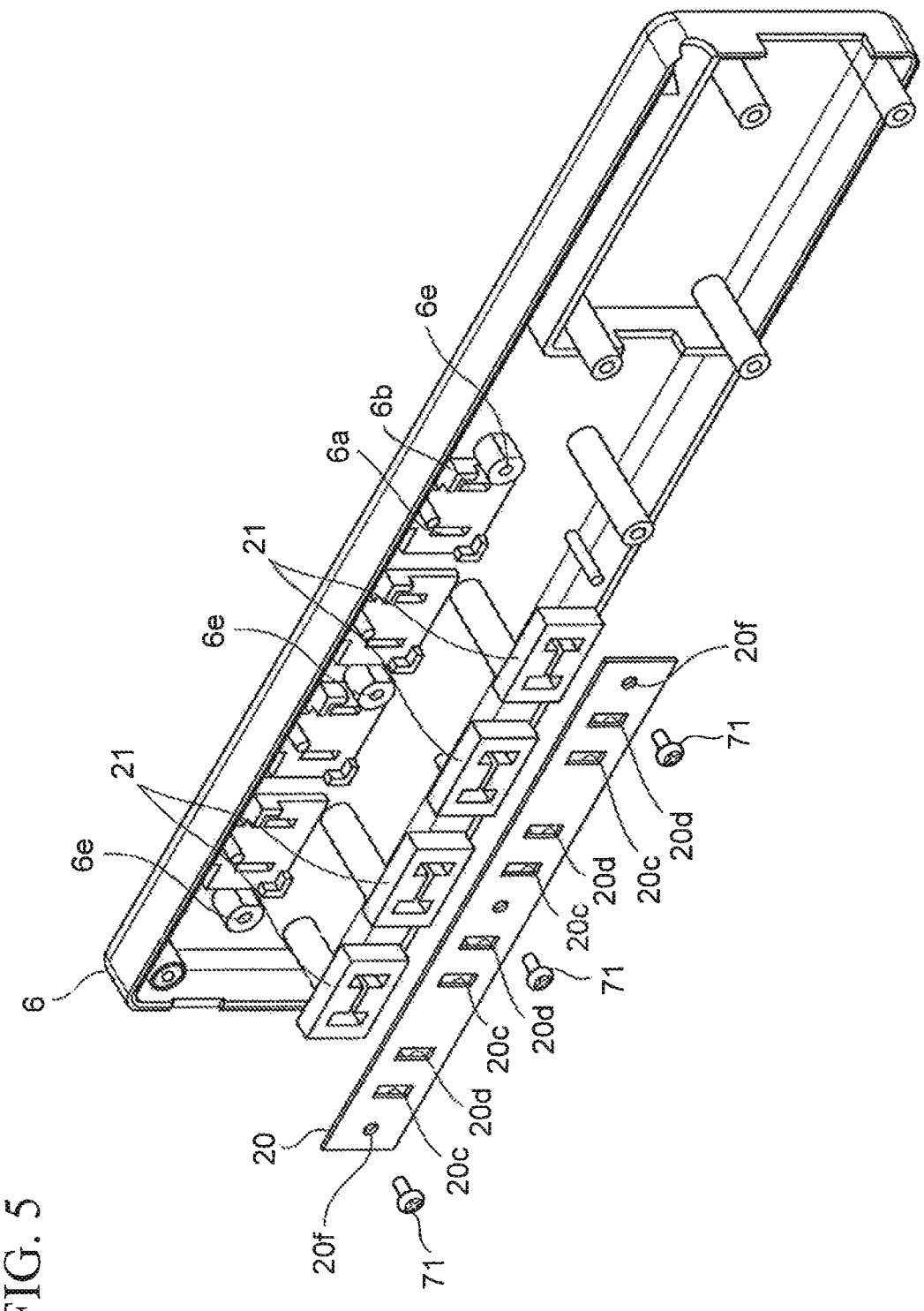
FIG. 5 is a perspective view (No. 1) for illustrating a method of mounting magnetic cores onto an upper casing of the power strip according to the first embodiment.
Figure 6:
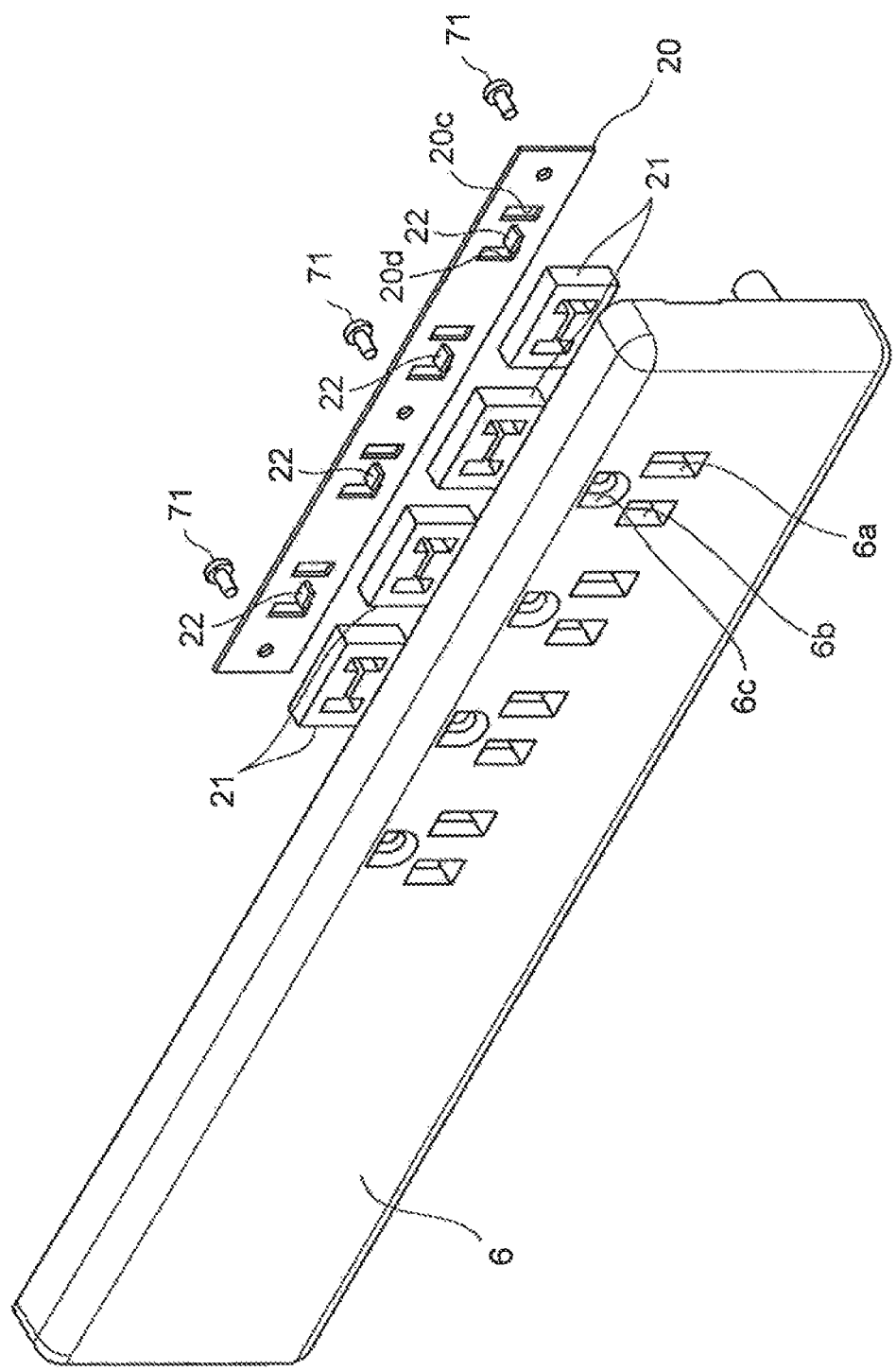
FIG. 6 is a perspective view (No. 2) for illustrating a method of mounting the magnetic cores onto the upper casing of the power strip according to the first embodiment.
Figure 7:
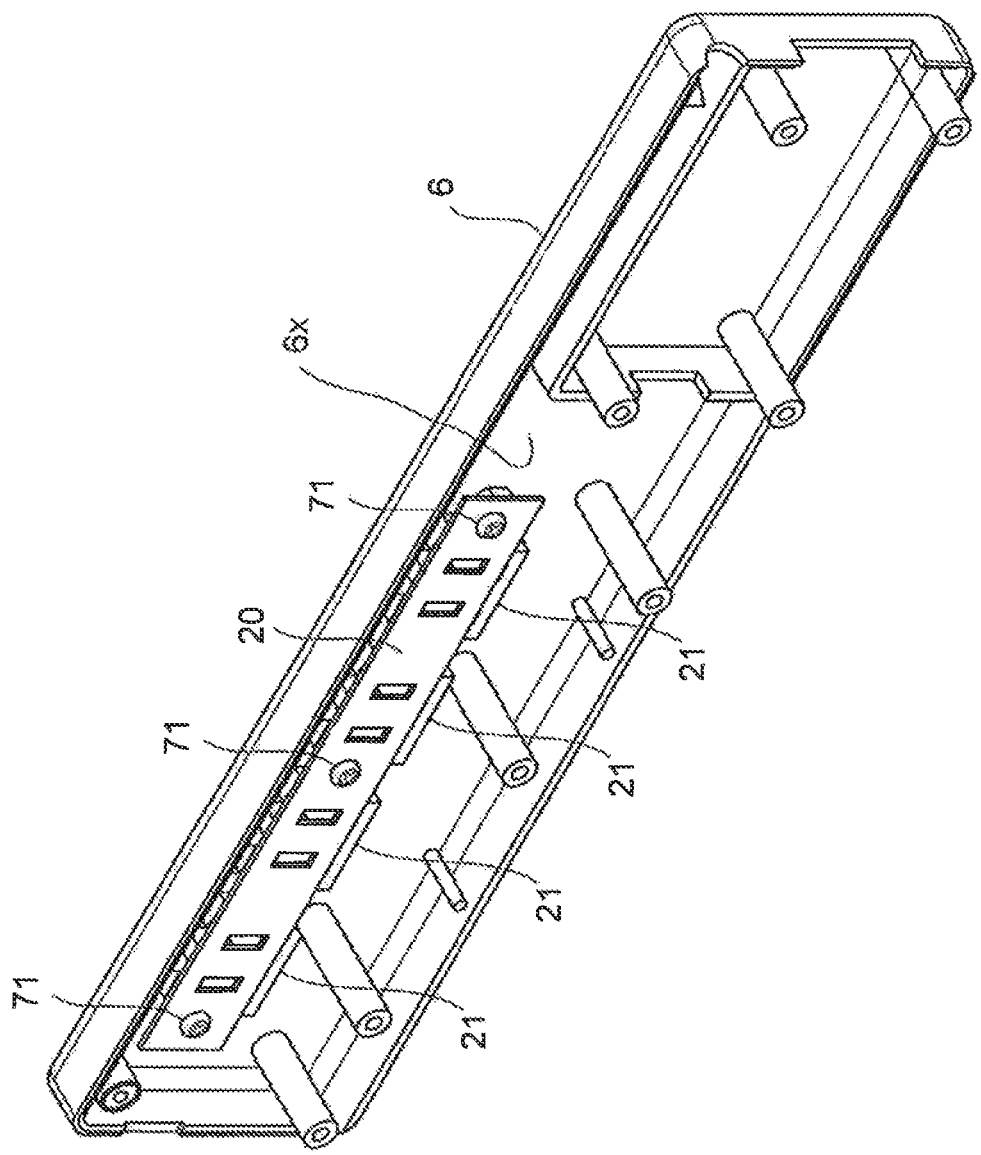
FIG. 7 is a perspective view (No. 3) for illustrating a method of mounting the magnetic cores onto the upper casing of the power strip according to the first embodiment.

FIGS. 5 to 7 are perspective views for illustrating a method of mounting the magnetic cores 21 to the upper casing 6.

As illustrated in FIG. 5, the first circuit board 20 is provided with a plurality of first holes 20c corresponding to first openings 6a of the upper casing 6, and a plurality of second holes 20d corresponding to second openings 6b of the upper casing 6.

When the magnetic cores 21 are mounted, as illustrated in FIG. 5, the magnetic cores 21 and the first circuit board 20 are prepared sequentially from the upper casing 6. Then, screw holes 20f of the first circuit board 20 and screw holes 6e of the upper casing 6 are aligned, and then screws 71 are inserted into the screw holes 6e and 20f.

FIG. 6 is a perspective view from a front side of the upper casing 6 at the time of mounting.

As illustrated in FIG. 6, a plurality of magnetic sensors 22 corresponding to the magnetic cores 21 are stand on the first substrate 20.

FIG. 7 is a perspective view of the upper casing 6 after the magnetic cores 21 are mounted.

As illustrated in FIG. 7, the first circuit board 20 is fixed on an inner surface 6x of the upper casing 6 with the screws 71, and the magnetic cores 21 are fixed on the inner surface 6x by pressing force of the screws 71.

The number of parts can be reduced compared with the case where the magnetic core 21 are separately fixed, by fixing the plurality of magnetic cores 21 by using only a single first circuit board 20. Accordingly, the cost can be reduced, and the power strip can be easily assembled.

Note that the mounting method using the screws 71 is employed in second to fourth embodiments to be described later.

Figure 8:
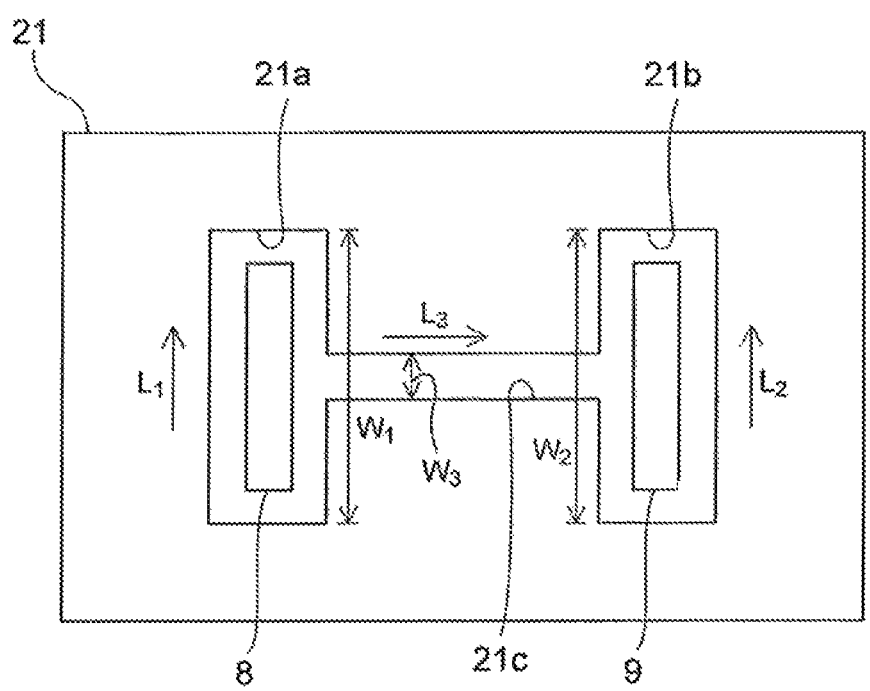
FIG. 8 is a plan view of the magnetic core which is provided to the power strip according to the first embodiment.

FIG. 8 is a plan view of the magnetic core 21.

As illustrated in FIG. 8, the magnetic core 21 has a rectangular external shape, and includes a first opening 21a into which the first plug blade 8 is inserted and a second opening 21b into which the second plug blade 9 is inserted.

These openings 21a and 21b have a rectangular shape in a plan view, and extending directions $L_1$ and $L_2$ of the openings 21a and 21b are parallel with each other.

A rectangular slit 21c through which these openings 21a and 21b are communicated is provided between the openings 21a and 21b. The shape of the slit 21c is rectangular in a plan view, and the extending direction $L_3$ of the slit 21c is perpendicular to the extending directions $L_1$ and $L_2$ of the respective openings 21a and 21b. Accordingly, the openings 21a and 21b are combined with the slit 21c to form a substantially H shape in a plan view.

Also, a width $W_3$ of the slit 21c is narrower than each of widths $W_1$ and $W_2$ of the respective plug blades 8 and 9. In the embodiment, the width $W_3$ is set to approximately 1.4 mm.

Although the material of the magnetic core 21 is not particularly limited, ferrite that is easily available is used in the present embodiments.

Figure 9:
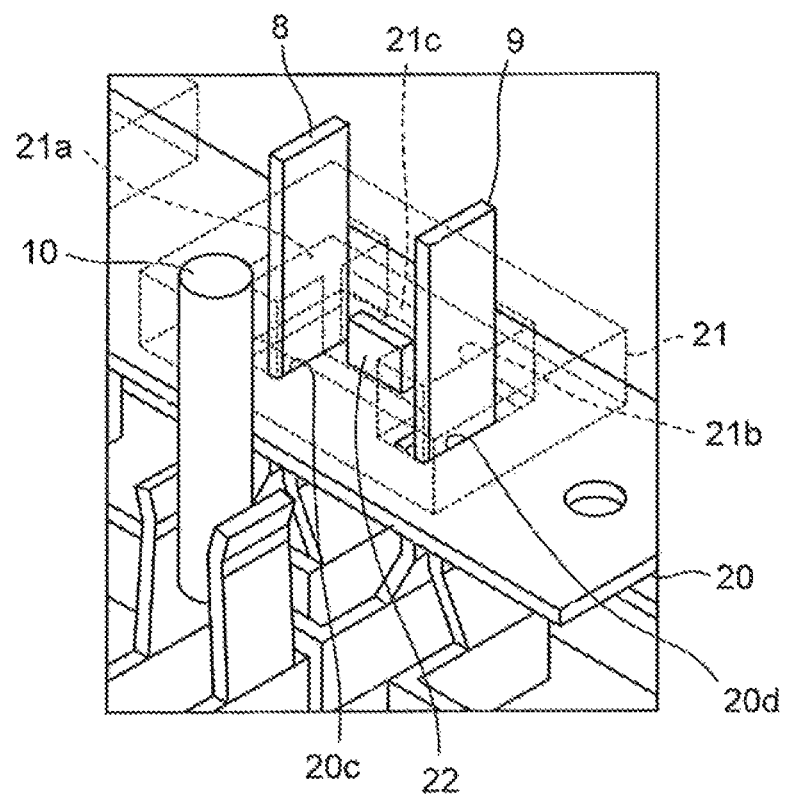
FIG. 9 is a perspective view of the magnetic core and a periphery thereof when a plug is inserted in the first embodiment.

FIG. 9 is a perspective view of the magnetic core 21 and its periphery when the plug blades 8 and 9 are inserted into the core 21.

As illustrated in FIG. 9, the plug blades 8 and 9 are inserted respectively into the first hole 20c and second hole 20d of the first circuit board 20.

A Hall element as the magnetic sensor 22 is soldered on the first circuit board 20. The magnetic sensor 22 is housed in the slit 21c and functions to measure a value of current flowing through the plug blades 8 and 9 based on the intensity of a magnetic field in the slit 21c.

Figure 10:
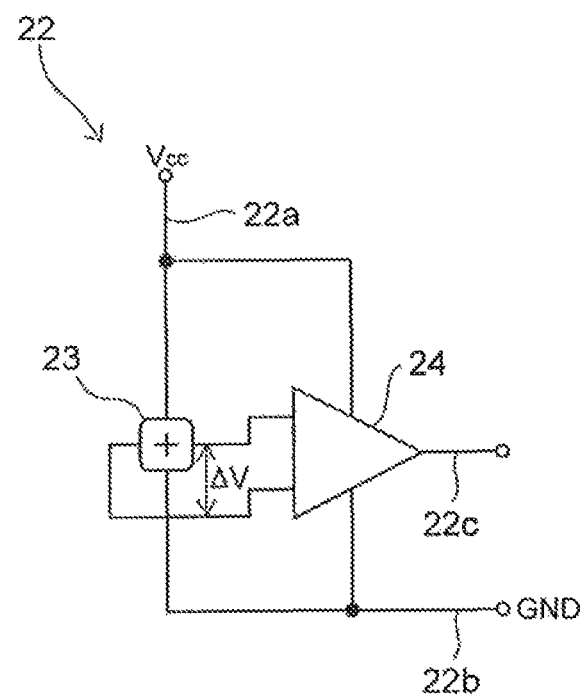
FIG. 10 is a circuit diagram of a magnetic sensor which is provided to the power strip according to the first embodiment.

FIG. 10 is a circuit diagram of the Hall element which is provided as the magnetic sensor 22.

As illustrated in FIG. 10, the magnetic sensor 22 includes a gallium-arsenide-based magnetic sensing unit 23 and a differential amplifier 24.

When the magnetic sensing unit 23 is exposed to a magnetic field in the state where a voltage Vcc is applied between a power terminal 22a and an earth terminal 22b, the magnetic sensing unit 23 generates a potential difference $\Delta V$ according to the intensity of the magnetic field. The potential difference $\Delta V$ is amplified in the differential amplifier 24 and then is output to the external.

Figure 11:
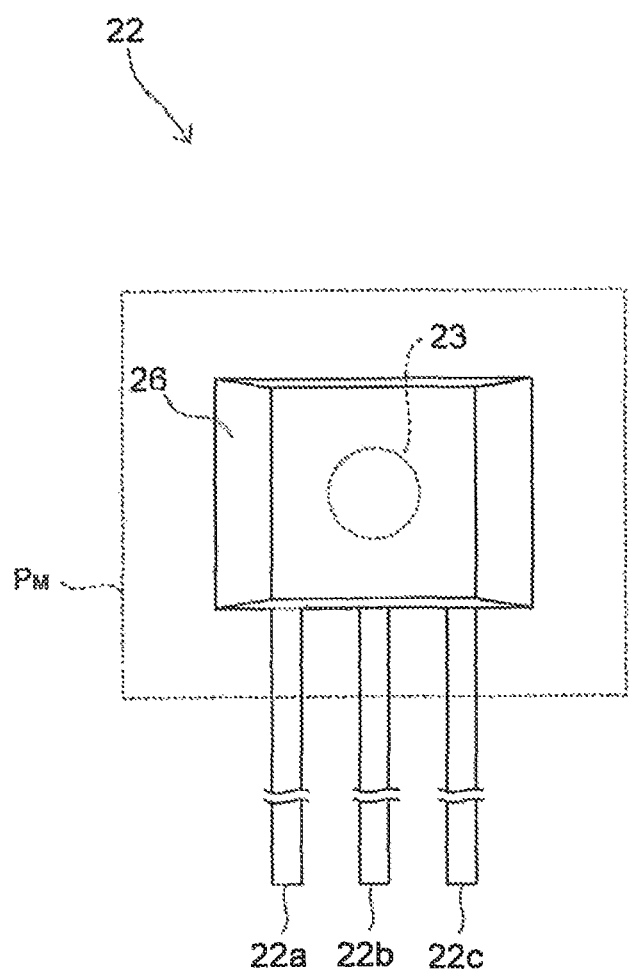
FIG. 11 is a plan view of the magnetic sensor which is provided to the power strip according to the first embodiment.

FIG. 11 is a plan view of the magnetic sensor 22.

As illustrated in FIG. 11, the magnetic sensing unit 23 is encapsulated by a resin 26 so as to be positioned within a magnetic sensing surface $P_M$. Then, the magnetic sensor 22 detects a magnetic field component vertical to the magnetic sensing surface $P_M$ among the magnetic fields passing through the magnetic sensing unit 23, and outputs an output signal corresponding to the intensity of the magnetic field component from an output terminal 22c.

Note that each of the terminals 22a to 22c is electrically connected to a wire in the first circuit board 20 (see FIG. 9) by soldering or the like.

The Hall element which is used as the magnetic sensor 22 is smaller than other elements such as a current transformer. Thus, the size of the power strip is not likely to increase.

Furthermore, the current transformer measures an intensity of the magnetic field by utilizing an inductive current which is generated according to a temporal change of the magnetic field. Thus, a measurement target of the current transformer is limited to an alternating-current magnetic field. However, the Hall element has an advantage of being capable of measuring an intensity of a static magnetic field.

In addition, the Hall element is less expensive than the current transformer. Thus, the cost of the power strip can be prevented from increasing.

Figure 12:
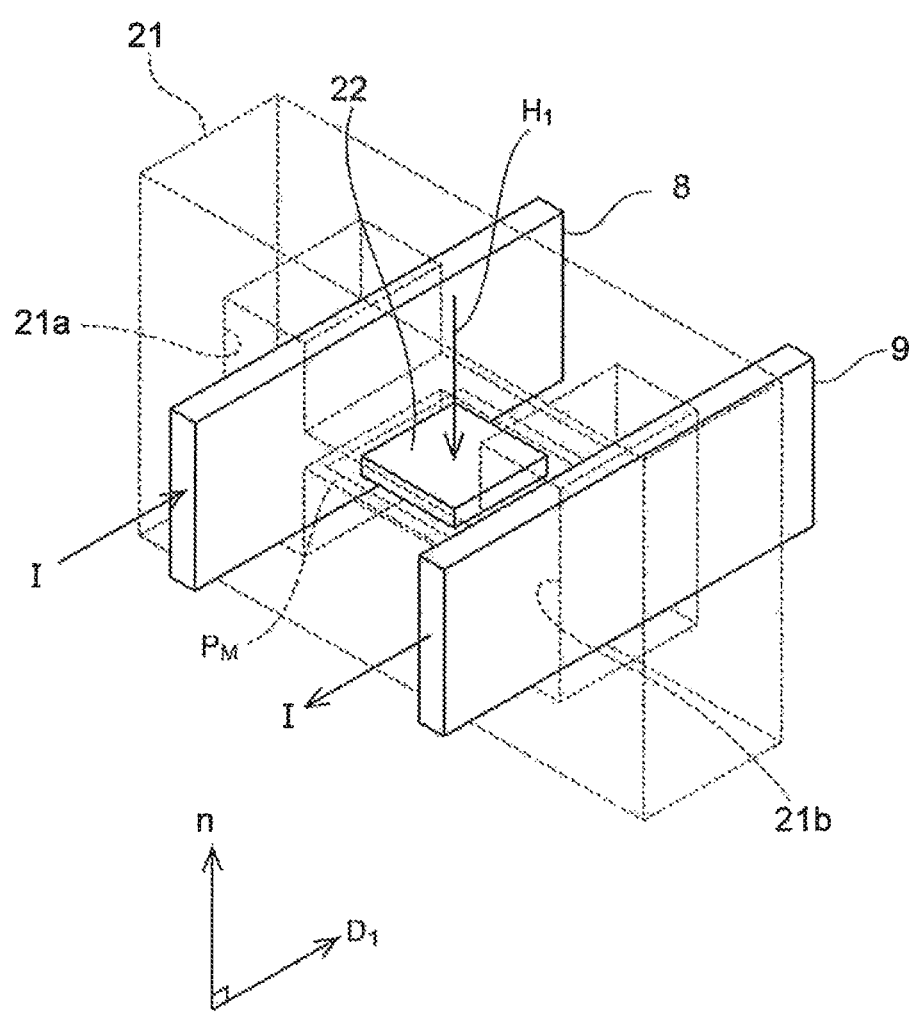
FIG. 12 is a perspective view for illustrating a positional relationship between a magnetic sensing surface of the magnetic sensor which is provided to the power strip and each plug blade according to the first embodiment.

FIG. 12 is a perspective view for illustrating a positional relationship between the magnetic sensing surface $P_M$ of the magnetic sensor 22 and each of the plug blades 8 and 9.

Normal direction n of the magnetic sensing surface $P_M$ is perpendicular to the extending direction $D_1$ of each of the first plug blade 8 and the second plug blade 9, namely a depth direction of each of the openings 21a and 21b. With this configuration, a magnetic field $H_1$ which is generated by a current I flowing through each of the plug blades 8 and 9 passes through the magnetic sensing surface $P_M$ substantially vertically, and thus a current detection sensitivity of the magnetic sensor 22 is improved.

Figure 13:
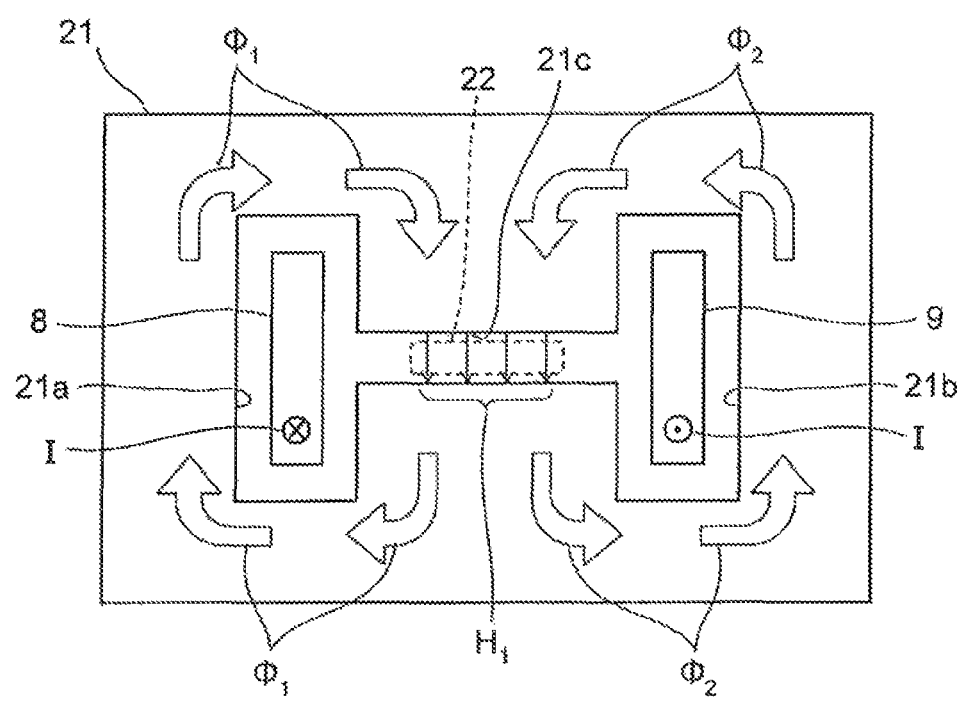
FIG. 13 is a plan view schematically illustrating a state of a magnetic flux which is generated in the periphery of the plug blades in the first embodiment.

FIG. 13 is a plan view schematically illustrating a state of magnetic fluxes $\Phi_1$ and $\Phi_2$ which are generated in the peripheries of the plug blades 8 and 9.

The first magnetic flux $\Phi_1$ and the second magnetic flux $\Phi_2$ are generated in the magnetic core 21 in the peripheries of the plug blades 8 and 9 by currents I flowing through the plug blades 8 and 9.

The current I is first supplied to an external electrical device through one of the plug blades 8 and 9, and then returns through the other plug blade. Thus, the directions of the currents I flowing through the plug blades 8 and 9 become opposite to each other. Accordingly, a direction of one of the magnetic fluxes $\Phi_1$ and $\Phi_2$ becomes clockwise and the other becomes counterclockwise.

As a result, the directions of the magnetic fluxes $\Phi_1$ and $\Phi_2$ become substantially the same in the vicinity of the slit 21c between the plug blades 8 and 9. For this reason, the magnetic field $H_1$ which is generated in the slit 21c by these magnetic fluxes $\Phi_1$ and $\Phi_2$ is intensified to have a higher intensity as compared with a magnetic field which is generated only from one of the plug blades 8 and 9.

Accordingly, even when an intensity of the current I is small, the magnetic field $H_1$ having an intensity large enough to be detected by the magnetic sensor 22 (see FIG. 12) can be generated. Thus, the accuracy in measuring the current I by the magnetic sensor 22 is improved.

Moreover, as illustrated in FIG. 8, the width $W_3$ of the slit 21c is set smaller than each of the widths $W_1$ and $W_2$ of the openings 21a and 21b. Thus, the inner surface of the slit 21c can be brought closer to the magnetic sensor 22. In the present embodiment, the width $W_3$ of the slit 21c is 1.4 mm as described above, while the thickness of the magnetic sensor 22 is approximately 1.2 mm, so that the magnetic sensor 22 is brought as close as possible to the inner surface of the slit 21c.

Accordingly, the magnetic field $H_1$ can be concentrated in the magnetic sensor 22, so that the accuracy in measuring the current I by the magnetic sensor 22 can be further improved.

The above-described improvement of the measurement accuracy is particularly effective, when an external electrical device is in a stand-by state with a power consumption of 1 W or less and thus the intensity of the current I is weak.

Furthermore, in the case where the plug blades 8 and 9 are not inserted into the plug insertion portion 1a (see FIG. 1), the current I does not flow through the plug blades 8 and 9, and thus the magnetic field $H_1$ is not generated. Thus, the magnetic sensor 22 is not likely to measure a magnetic field by mistake when the plug insertion portion 1a is unused.

Figure 14A:
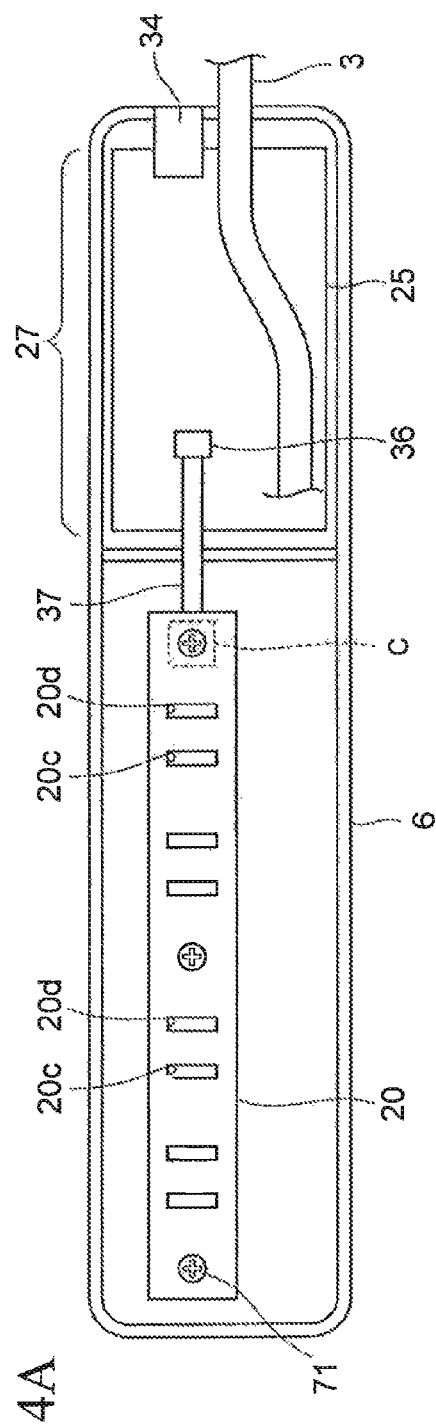
FIG. 14A is a plan view of an inner side of the upper casing which is provided to the power strip according to the first embodiment.

FIG. 14A is a plan view of the inner side of the upper casing 6.

As illustrated in FIG. 14A, a transmission circuit unit 27 to house a second circuit board 25 is defined in the upper casing 6.

A connector 36 is provided in the second circuit board 25 and is connected to a communication cable 37.

The communication cable 37 has an end portion which is connected to a connection portion C of the first circuit board 20. The communication cable 37 has a function of taking power required for driving each magnetic sensor 22 from the power cord 3 and supplying the power to the first circuit board 20, and a function of transmitting an output signal of each magnetic sensor 22 to the second circuit board 25.

Figure 14B:
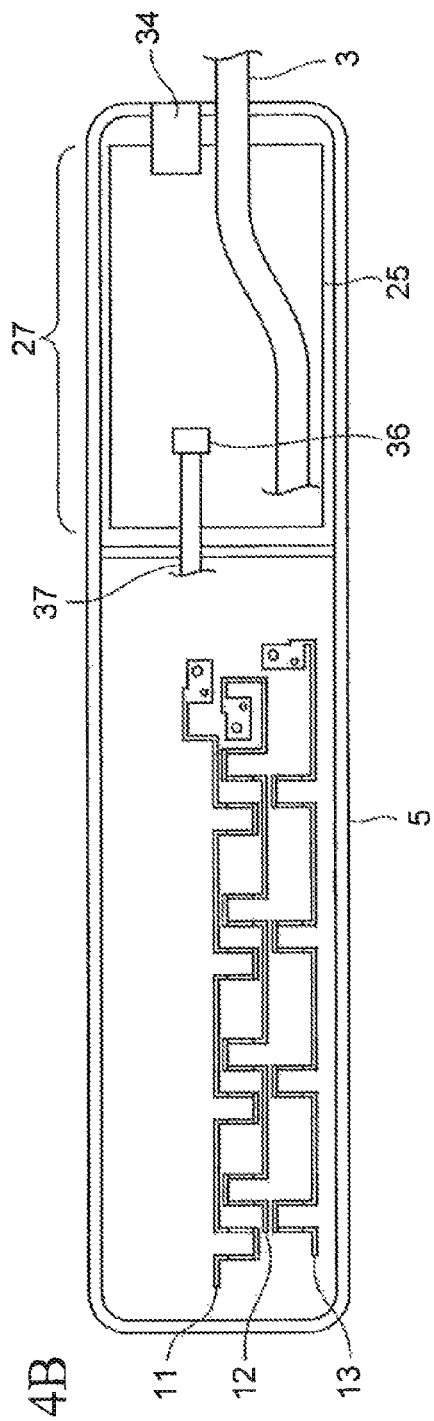
FIG. 14B is a plan view of an inner side of a lower casing when a transmission circuit unit is provided to the power strip according to the first embodiment.

Note that the transmission circuit unit 27 may be provided in the lower casing 5 as illustrated in FIG. 14B instead of being provided in the upper casing 6 as described above.

FIG. 14B is a plan view of an inner side of the lower casing 5 when the transmission circuit unit 27 is provided.

In this case, the second circuit board 25 is provided in the transmission circuit unit 27 of the lower casing 5. Then, the communication cable 37 may be connected to the connector 36 of the second circuit board 25, and an end portion of the communication cable 37 is connected to the connection portion C (see FIG. 14A) of the first circuit board 20.

Figure 15:
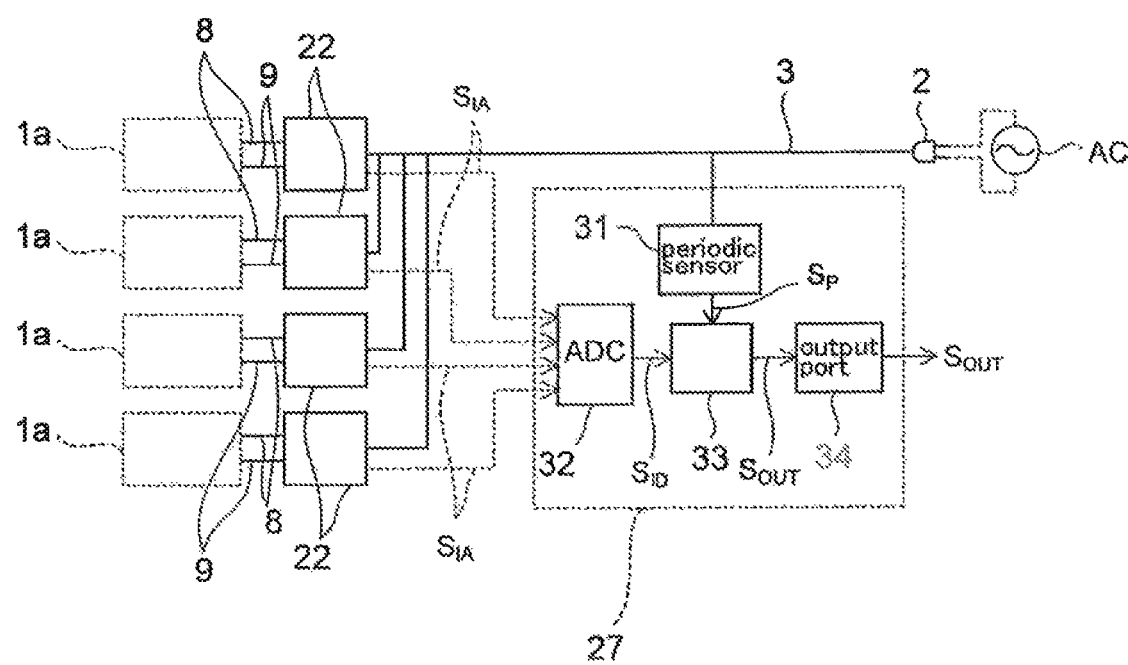
FIG. 15 is a functional block diagram of the transmission circuit unit which is provided to the power strip according to the first embodiment.

FIG. 15 is a functional block diagram of the transmission circuit unit 27.

As illustrated in FIG. 15, the transmission circuit unit 27 has a periodic sensor 31 to detect a period of alternating-current power flowing through the power cord 3, an AD converter 32 to digitalize an analog signal output from each magnetic sensor 22, a calculating unit 33, and an output port 34.

The transmission circuit unit 27 functions as follows.

First, an analog current signal $S_{IA}$ in response to the intensity of the current I flowing through the plug blades 8 and 9 is output from each magnetic sensor 22 via the output terminal 22c (see FIG. 10).

The analog current signal $S_{IA}$, which is an analog value, is digitalized in the AD converter 32 to be a digital current signal $S_{ID}$.

The periodic sensor 31 is a photo coupler, for example, which detects a cycle of alternating-current power flowing through the power code 3 connected to the alternating-current power source AC, and then outputs a periodic signal $S_p$ rising from "0" to "1" in synchronization with the cycle. For example, when the cycle of the alternating-current power is 50 Hz, the periodic signal $S_p$ also rises from "0" to "1" at the cycle of 50 Hz.

The calculating unit 33 measures a rising cycle of a signal in the above-described periodic signal $S_p$ and identifies the cycle as a cycle T of the alternating-current power. Furthermore, the calculating unit 33 uses 64/T as a sampling frequency and takes the digital current signal $S_{ID}$ at the sampling frequency.

Although the calculating unit 33 is not particularly limited, an 8-bit MPU (Micro Processing Unit) is used in this embodiment.

Then, the calculating unit 33 formats the digital current signal $S_{ID}$ into USB (Universal Serial Bus) standards, which is output as an output signal $S_{out}$ to the output port 34.

Note that the standards of the output signal $S_{out}$ are not limited to the USB standards. The output signal $S_{out}$ can be formatted into any standards such as wired LAN (Local Area Network) or wireless LAN.

Also, a multiplier may be provided in the calculating unit 33. In this case, a power supply voltage of the alternating-current power source AC may be multiplied by the digital current signal $S_{ID}$ in the multiplier so as to obtain an amount of power consumed by an electrical device connected to each of the plug insertion portions 1a.

Next, the electrical power measurement system utilizing the power strip 1 is described.

Figure 16:
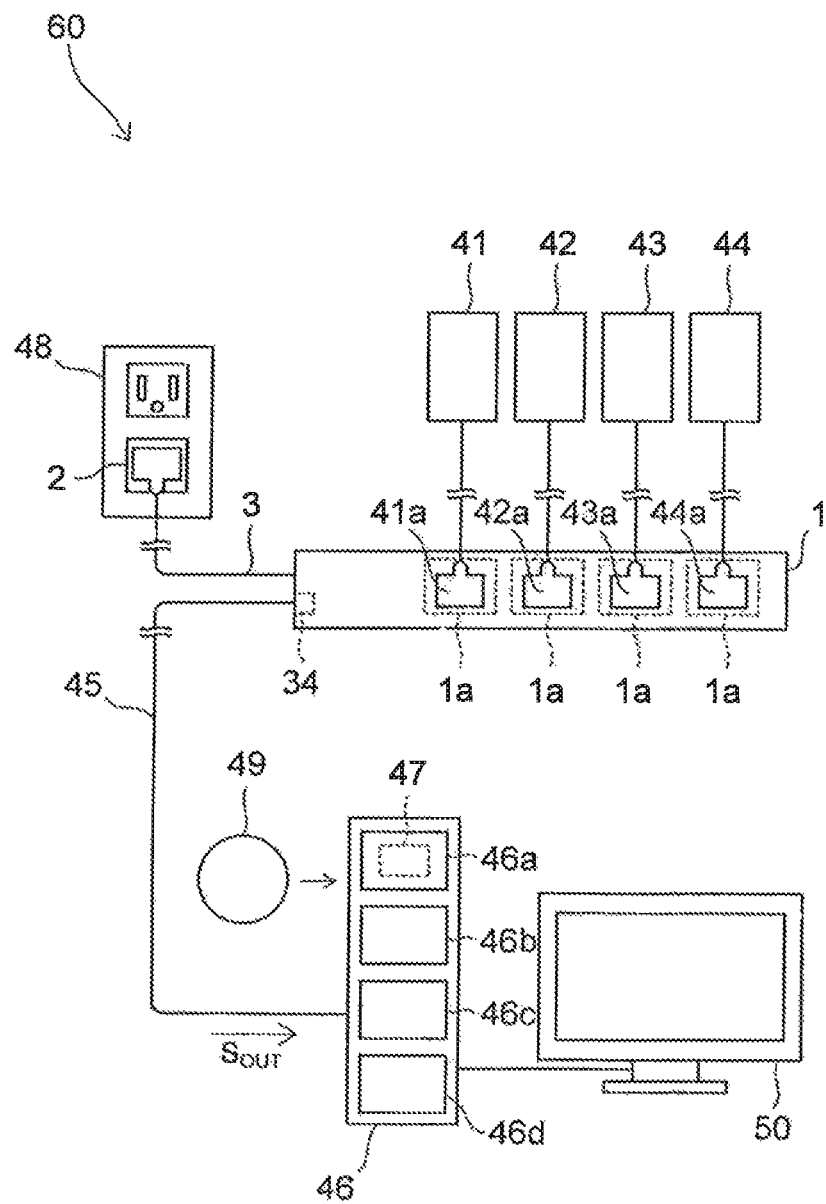
FIG. 16 is a schematic diagram for illustrating an electrical power measurement system according to the first embodiment.

FIG. 16 is a schematic diagram for illustrating the electrical power measurement system 60 according to this embodiment.

As illustrated in FIG. 16, when the power strip 1 is used, the plug 2 is inserted into a wall power 48 so that the power cord 3 is connected to the alternating-current power source AC (see FIG. 15).

Then, socket plugs 41a to 44a of first to fourth electrical devices 41 to 44 are respectively inserted into the plug insertion portions 1a of the power strip 1. Note that not all of the plug insertion portions 1a have to be connected to the electrical devices. Some of the plug insertion portions 1a may remain unused.

Furthermore, a computer 46 such as a personal computer and the output port 34 of the power strip 1 are connected via a signal cable 45 such as a USB cable.

With this configuration, a value of each current, which is supplied from each plug insertion portion 1a to the electrical devices 41 to 44, is taken into the computer 46, as the above-described output signal $S_{out}$.

The computer 46 is provided with a storage unit 46a such as a hard disk. In addition, the storage unit 46a stores a program 47 which calculates individual power consumptions of the electrical devices 41 to 44 for each of the electrical devices 41 to 44 by multiplying the power-supply voltage of the wall power 48 by the current contained in the output signal $S_{out}$.

A method of storing the program 47 in the storage unit 46a is not particularly limited. For example, an unillustrated CD (Compact Disk) driver which is provided in the computer 46 may be used so that the computer 46 reads the program 47 stored in a storage medium 49 such as a CD and then the program 47 is stored in the storage unit 46a.

When being used, the program 47 is loaded onto a RAM (Random Access Memory) 46b, and the calculating unit 46c such as a CPU utilizes the program 47 to calculate the individual power consumptions of the electrical devices 41 to 44. Then, the calculation result for each of the plug insertion portions 1a is displayed on a monitor 50.

Note that, when the calculating unit 33 (see FIG. 15) is provided with the multiplier as described above, the computer 46 does not need to execute the calculation. The amount of electricity in each plug insertion portion 1a, which is contained in the output signal $S_{out}$, is displayed on the monitor 50.

Thus, the user can grasp a power consumption of each of the electrical devices 41 to 44 in real time by monitoring the monitor 50. Therefore, the user can obtain information for deciding whether the power of each of the electrical devices 41 to 44 should be reduced for saving energy.

Also, a database 46d may be provided in the computer 46 to store the total power of the electrical devices 41 to 44 within a predetermined period in the database 46d. With this, the information for deciding whether the power should be reduced can be further increased.

According to this embodiment described above, as described referring to FIG. 16, the power consumption of each of the electrical devices 41 to 44 which are connected to the power strip 1 can be individually monitored.

Furthermore, as illustrated in FIG. 13, the first plug blade 8 and the second plug blade 9 are commonly surrounded by the magnetic core 21. Thus, the directions of the magnetic fluxes $\Phi_1$ and $\Phi_2$, which are generated in the peripheries of the plug blades 8 and 9, are aligned in the vicinity of the slit 21c, so that the magnetic field $H_1$ is intensified.

Therefore, a weak current I can be more easily measured with the magnetic sensor 22 as compared with the case where the magnetic field which is generated only by the current I flowing through the one of the plug blades 8 and 9. Thus, a sensitivity of detecting a current by the magnetic sensor 22 can be improved.

Furthermore, a measuring target of the magnetic sensor 22 is a magnetic field $H_1$ which is generated in the peripheries of the plug blades 8 and 9. Thus, the magnetic cores 21 to converge the magnetic field $H_1$ may be provided above the bus bars 11 to 13 as illustrated in FIG. 2. Accordingly, the magnetic cores 21 do not widen the distances $P_1$ and $P_2$ (see FIG. 2) among the bus bars 11 to 13. Thus, the size of the power strip 1 can be prevented from increasing.

In addition, the magnetic field $H_1$ can be measured without connecting new parts to the bus bars 11 to 13. Thus, the cost of the power strip 1 can be also prevented from increasing.

Second Embodiment

This embodiment describes a preferred positional relationship between the magnetic sensor 22 and the magnetic core 21.

Figure 17:
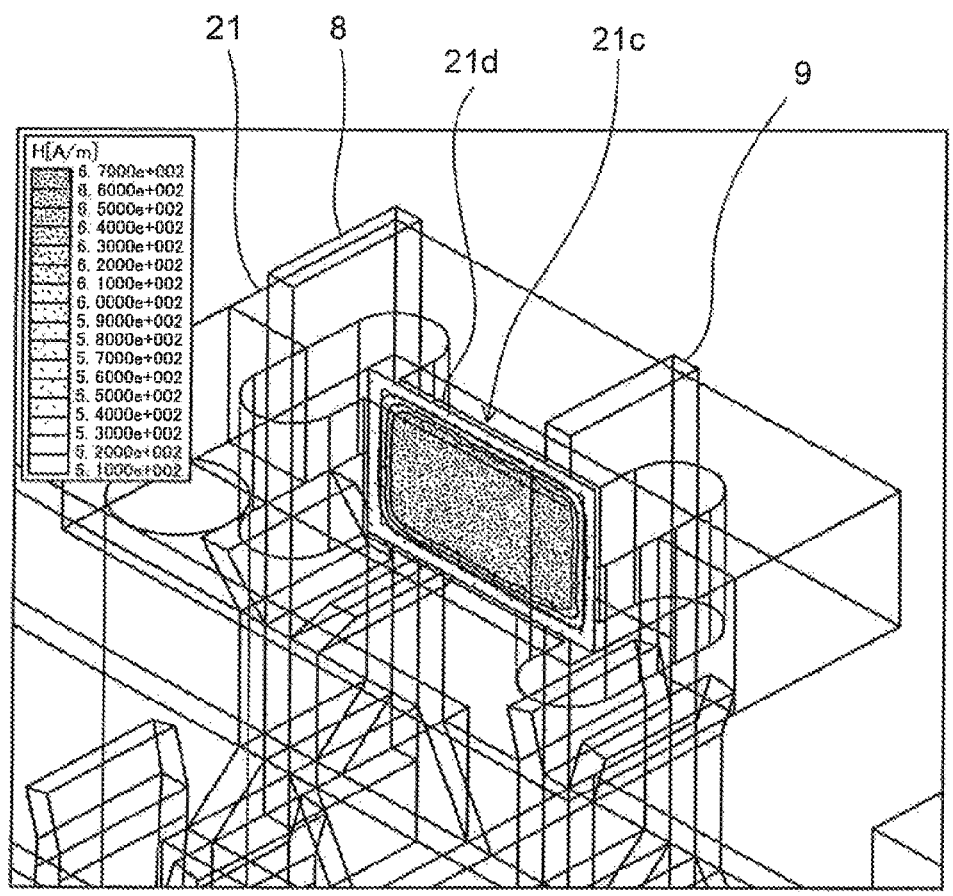
FIG. 17 is a perspective view for illustrating a simulation which was conducted by the inventor of this invention in a second embodiment.

FIG. 17 is a perspective view for illustrating a simulation which was conducted by the inventor. Note that in FIG. 17, elements same as those described in the first embodiment are denoted with the same reference numerals and the description thereof is omitted below.

As illustrated in FIG. 17, in this simulation, an intensity of a magnetic field in a surface 21d of the magnetic core 21 exposed to the slit 21c is simulated.

Figure 18:
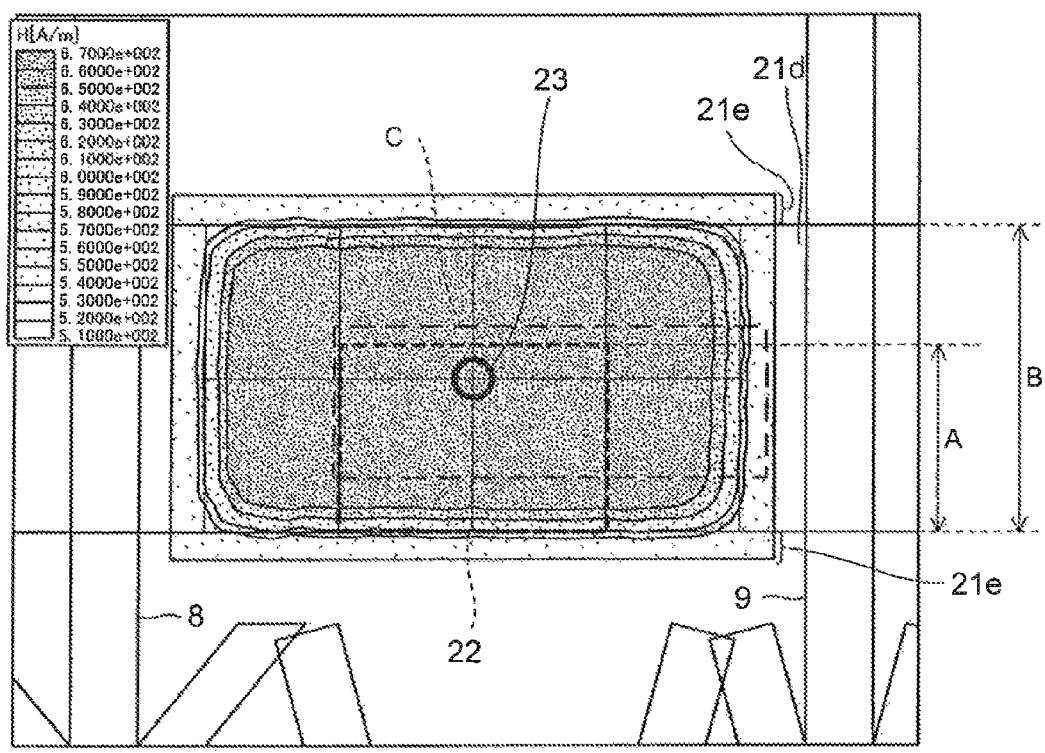
FIG. 18 is a drawing illustrating a result of the simulation which was conducted by the inventor of this invention in the second embodiment.

FIG. 18 is a drawing illustrating a result of the simulation.

As illustrated in FIG. 18, the intensity of the magnetic field is rapidly weaken in an edge 21e of the surface 21d as compared with that in a vicinity of the center C.

For this reason, in order to ensure an accuracy of measuring the magnetic field by the magnetic sensor 22, it is preferable that a magnetic-sensing portion 23 be positioned in a vicinity of the center C where a spatial variation of the magnetic field is small.

Note that when the magnetic sensor 22 is mounted on the first circuit board 20 (see FIG. 9), a certain level of misalignment is expected between the magnetic sensor 22 and the first circuit board 20. Thus, it is difficult to accurately position the magnetic-sensing portion 23, and the magnetic-sensing portion 23 is not positioned in the vicinity of the center C in some cases.

For this reason, it is preferable that an area of the surface 21d be sufficiently larger than an area of the magnetic-sensing portion 23 so as to increase a region where the magnetic field is substantially uniform in the surface 21d to reduce the risk of the magnetic-sensing portion 23 being positioned in a region such as the edge 21e where the magnetic field rapidly changes.

For example, as illustrated in FIG. 18, it is preferable that a height B of the surface 21d be approximately 1.5 to 2.5 times higher than a height A of the magnetic sensor 22 in the state where respective bottom sides of the magnetic sensor 22 and the surface 21d is aligned with each other, so that the magnetic-sensing portion 23 stays in the vicinity of the center C.

Third Embodiment

This embodiment describes the upper casing 6 that is suitable for mounting the magnetic cores 21.

Figure 19A:
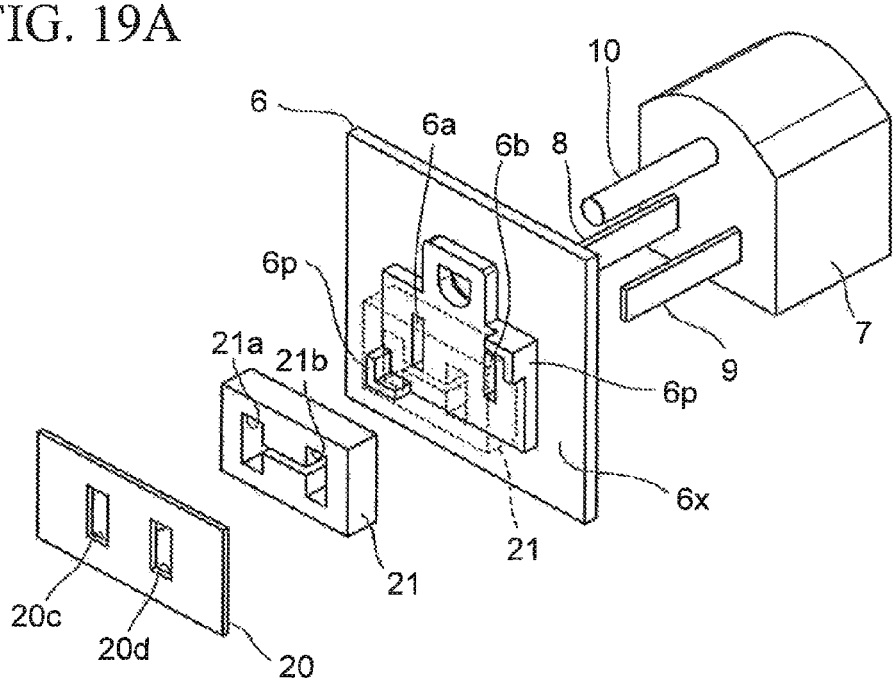
FIGS. 19A and 19B are perspective views (No. 1) of an upper casing which is provided to a power strip and a periphery thereof according to a third embodiment.
Figure 19B:
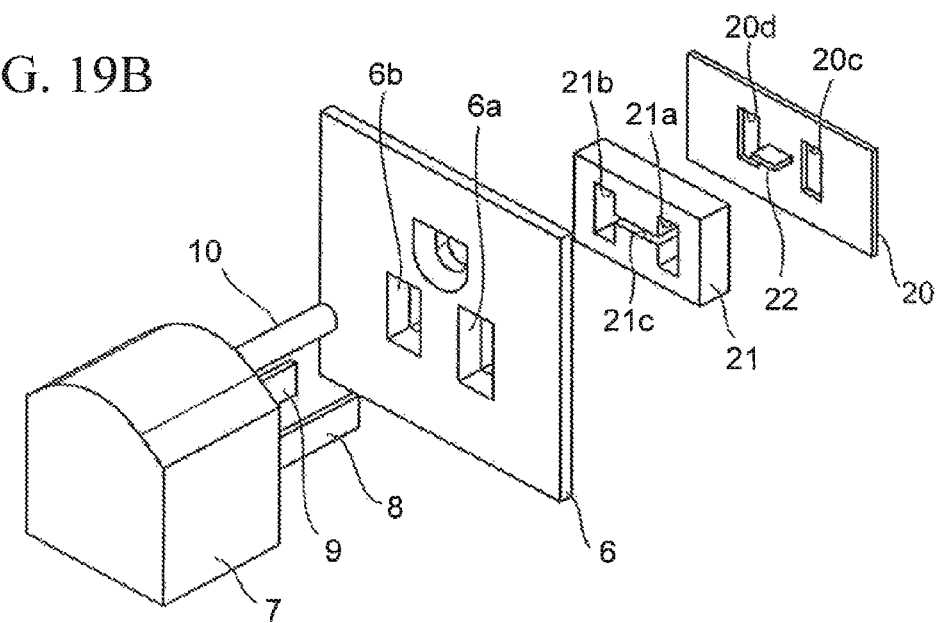
Figure 20:
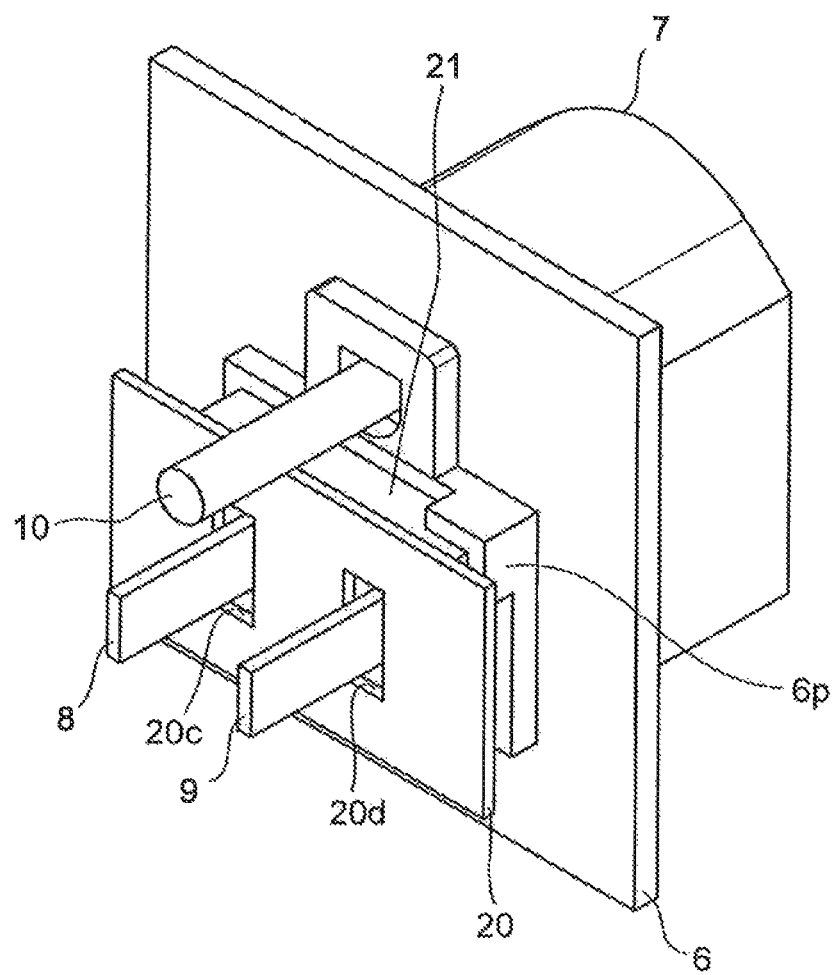
FIG. 20 is a perspective view (No. 2) of the upper casing which is provided to the power strip and the periphery thereof according to the third embodiment.

FIGS. 19 and 20 are enlarged perspective views of the upper casing 6 and a periphery thereof according to this embodiment. Note that in FIGS. 19 and 20, elements same as those described in the first embodiment are denoted with the same reference numerals and the description thereof is omitted below.

As illustrated in FIG. 19A, in this embodiment, a pair of L-shaped ribs 6p stand on the inner surface 6x of the upper casing 6. The L-shaped ribs clamp the rectangular magnetic core 21 from a diagonal direction of the magnetic core 21.

FIG. 19B is a perspective view from a socket plug 7.

As illustrated in FIG. 19B, the magnetic sensor 22 which stands on the first circuit board 20 is aligned with the slit 21c of the magnetic core 21.

FIG. 20 is a perspective view in the state where the socket plug 7 is inserted into the upper casing 6, and where the magnetic core 21 and the first circuit board 20 are fixed on the upper casing 6.

In this embodiment, the magnetic core 21 is clamped by the L-shaped ribs 6p as described above, and thus the upper core 6 and the magnetic core 21 can easily aligned, and the misalignment between the upper casing 6 and the magnetic core 21 in the assembled state can be prevented.

Fourth Embodiment

Figure 21A:
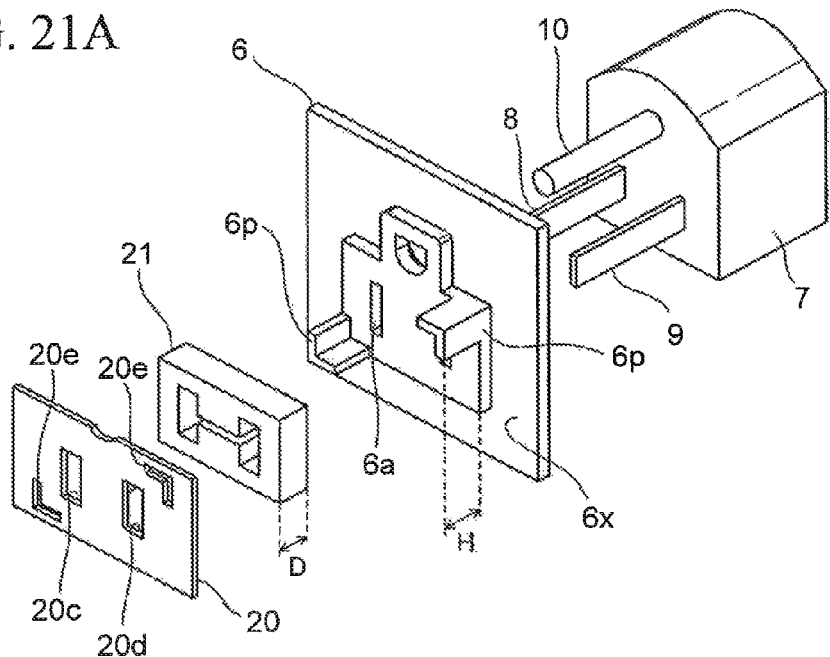
FIGS. 21A and 21B are perspective views (No. 1) of an upper casing which is provided to a power strip and a periphery thereof according to a fourth embodiment.
Figure 21B:
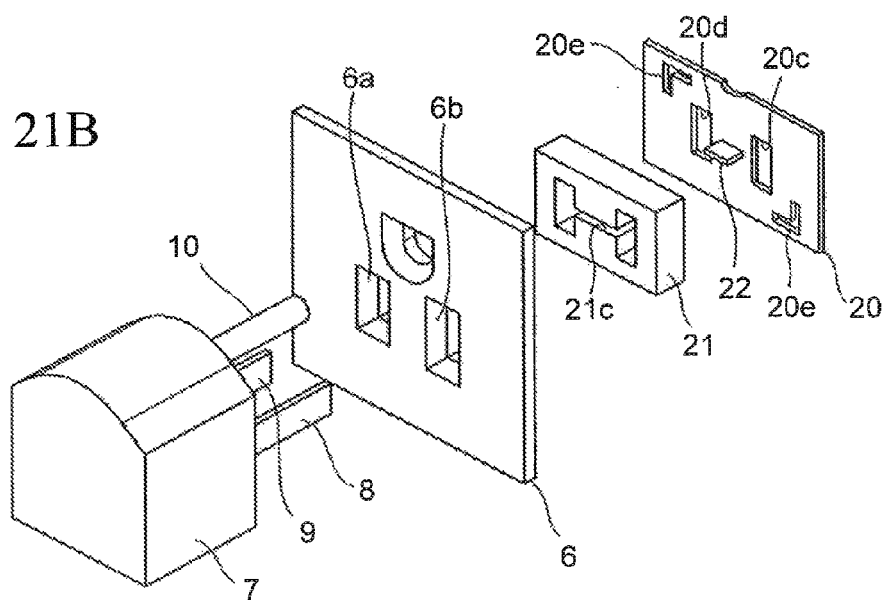
Figure 22:
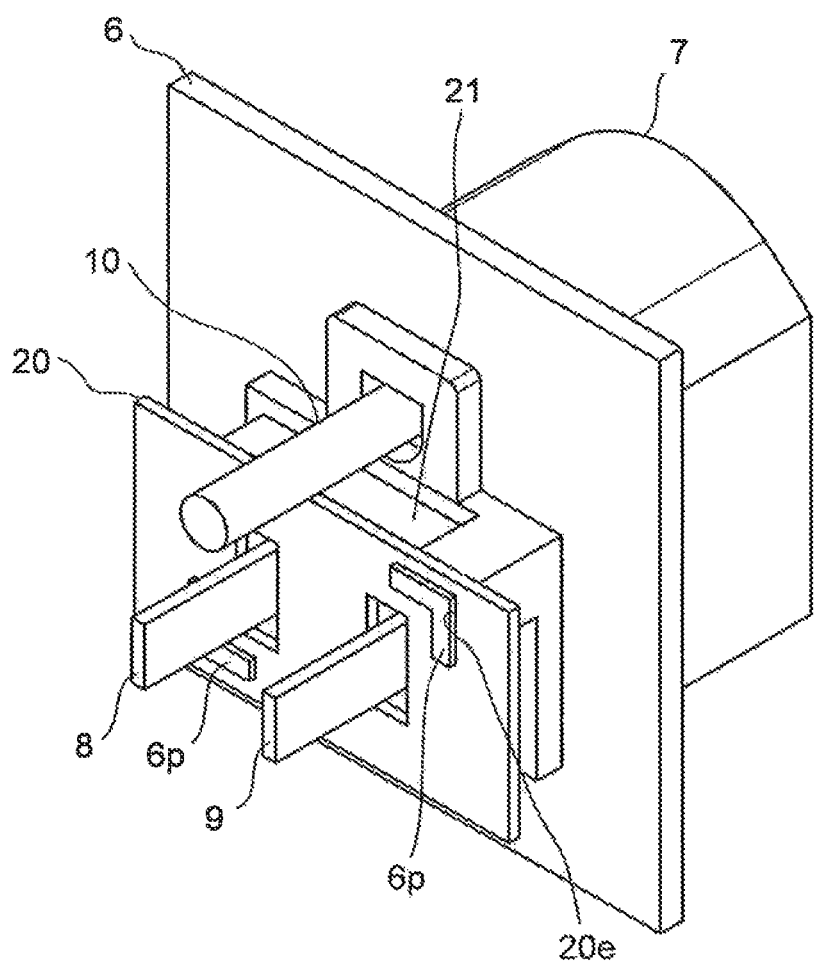
FIG. 22 is a perspective view (No. 2) of the upper casing which is provided to the power strip and the periphery thereof according to the fourth embodiment.

FIGS. 21 and 22 are enlarged perspective views of the upper casing 6 and a periphery thereof according to this embodiment. Note that in the FIGS. 21 and 22, elements same as those described in the third embodiment are denoted with the same reference numerals and the description thereof is omitted below.

As illustrated in FIG. 21A, in this embodiment, a height H of the L-shaped rib 6p of the upper casing 6 is made larger than the thickness D of the magnetic core 21. Then, a plurality of third L-shaped holes 20e, in which the plurality of L-shaped ribs 6p respectively fit, are formed in the first circuit board 20.

Note that FIG. 21B is a perspective view from the socket plug 7, where the slit 21c of the magnetic core 21 and the magnetic sensor 22 are aligned as in the third embodiment.

FIG. 22 is a perspective view in the state where the socket plug 7 is inserted into the upper casing 6, and in the state where the magnetic core 21 and the first circuit board 20 are fixed on the upper casing 6.

In this embodiment, the ribs 6p are made tall as described above, so that the L-shaped ribs 6p fit in the third holes 20e of the first circuit board 20. Accordingly, not only the L-shaped ribs 6p can clamp the magnetic core 21, but also the misalignment between the first circuit board 20 and the upper casing 6 is prevented.

Fifth Embodiment

Figure 23A:
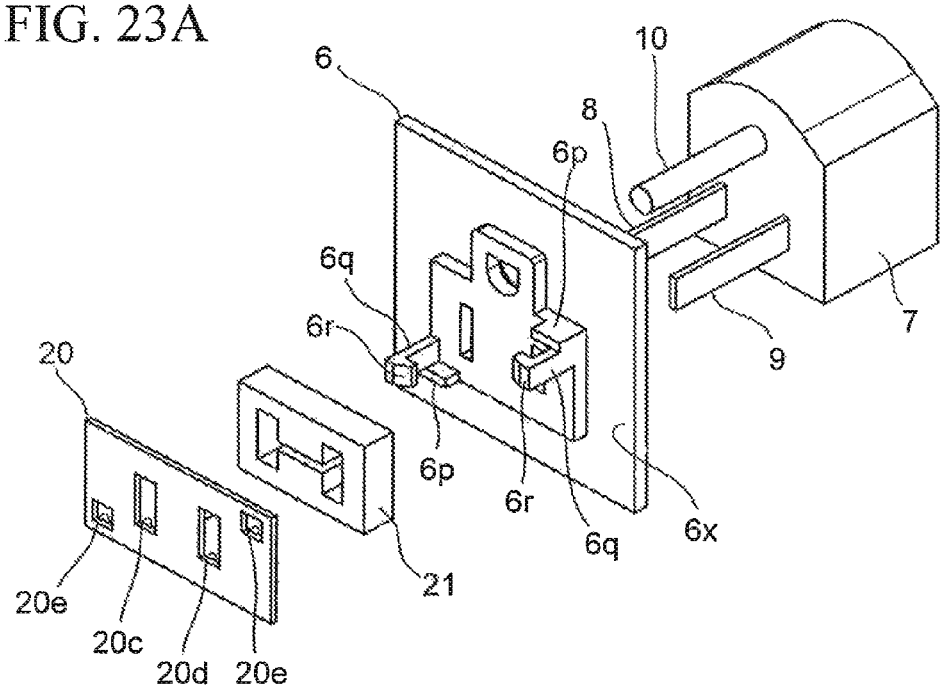
FIGS. 23A and 23B are perspective views (No. 1) of an upper casing which is provided to a power strip and a periphery thereof according to a fifth embodiment.
Figure 23B:
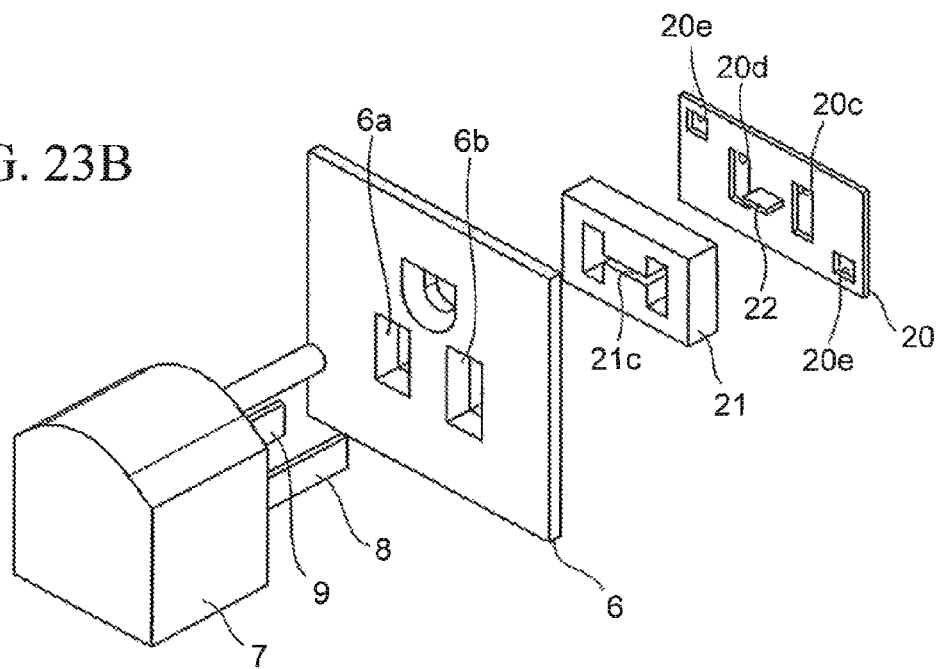
Figure 24:
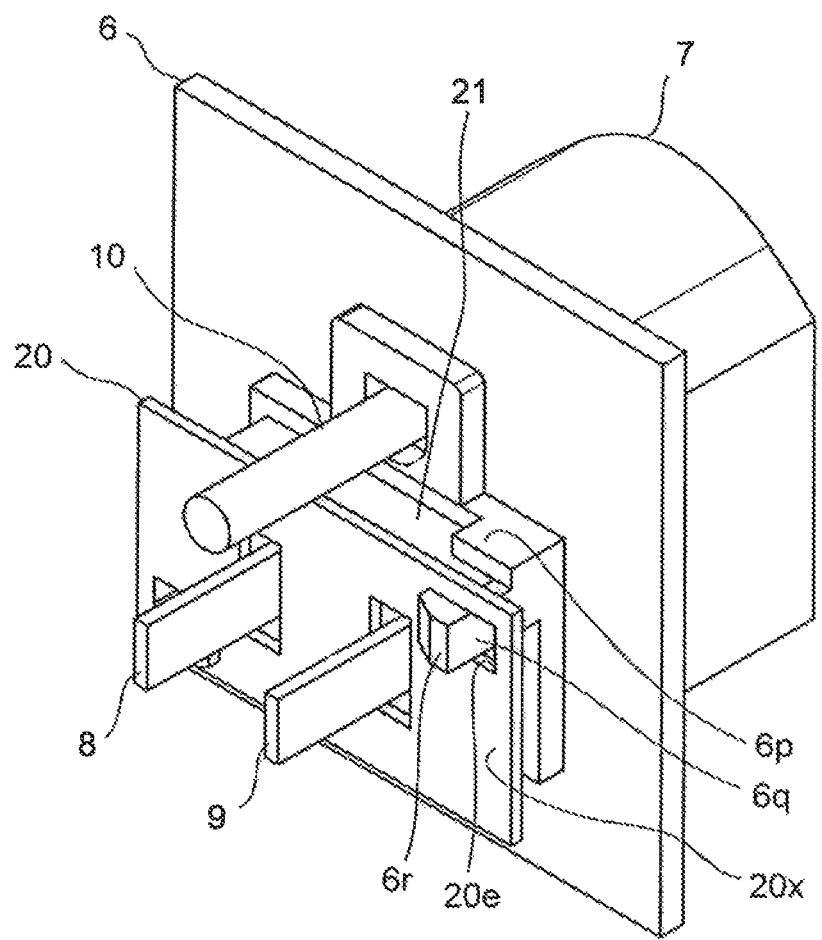
FIG. 24 is a perspective view (No. 2) of the upper casing which is provided to the power strip and the periphery thereof according to the fifth embodiment.

FIGS. 23 and 24 are enlarged perspective views of the upper casing 6 and a periphery thereof according to this embodiment. Note that in FIGS. 23 and 24, elements same as those described in the third embodiment are denoted with the same reference numerals and the description thereof is omitted below.

As illustrated in FIG. 23A, in this embodiment, an extended portion 6q is provided to the L-shaped rib 6p, and a claw 6r is formed on an end portion of the extended portion 6q. In addition, the third hole 20e of the first circuit board 20 has a rectangular shape through which the claw 6r passes.

Note that FIG. 23B is a perspective view from the socket plug 7, where the slit 21c of the magnetic core 21 and the magnetic sensor 22 are aligned as in the third embodiment.

FIG. 24 is a perspective view illustrating a state where the socket plug 7 is inserted into the upper casing 6 in the state where the magnetic core 21 and the first circuit board 20 are fixed on the upper casing 6.

In this embodiment, since the claw 6r is provided on the upper casing 6 as described above, a principal surface 20x of the first circuit board 20 is held by the claw 6r. Accordingly, the first circuit board 20 can be prevented from being misaligned in a normal direction of the principal surface 20x.

Furthermore, since the first circuit board 20 can be held by the claw 6r in this manner, the screw 71 (see FIG. 5) for fixing the first circuit board 20 on the upper casing 6 becomes unnecessary, and thus the number of parts can be reduced to reduce the costs.

Sixth Embodiment

This embodiment describes a method of manufacturing the first to third bus bars 11 to 13 described in the first embodiment.

Figure 25:
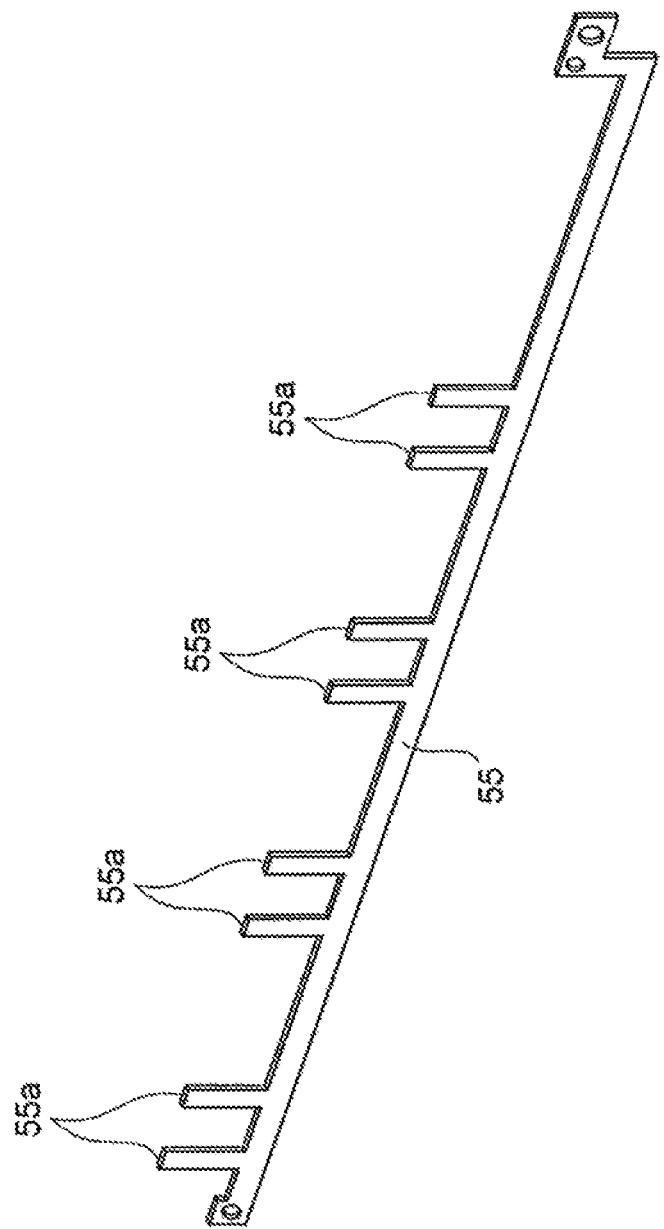
FIG. 25 is a perspective view of a conductive plate serving as bus bars in a sixth embodiment.

FIG. 25 is a perspective view of the conductive plate 55 serving as the bus bars 11 to 13.

The conductive plate 55 is formed by processing a brass plate using a die and includes a plurality of protrusions 55a.

Figure 26:
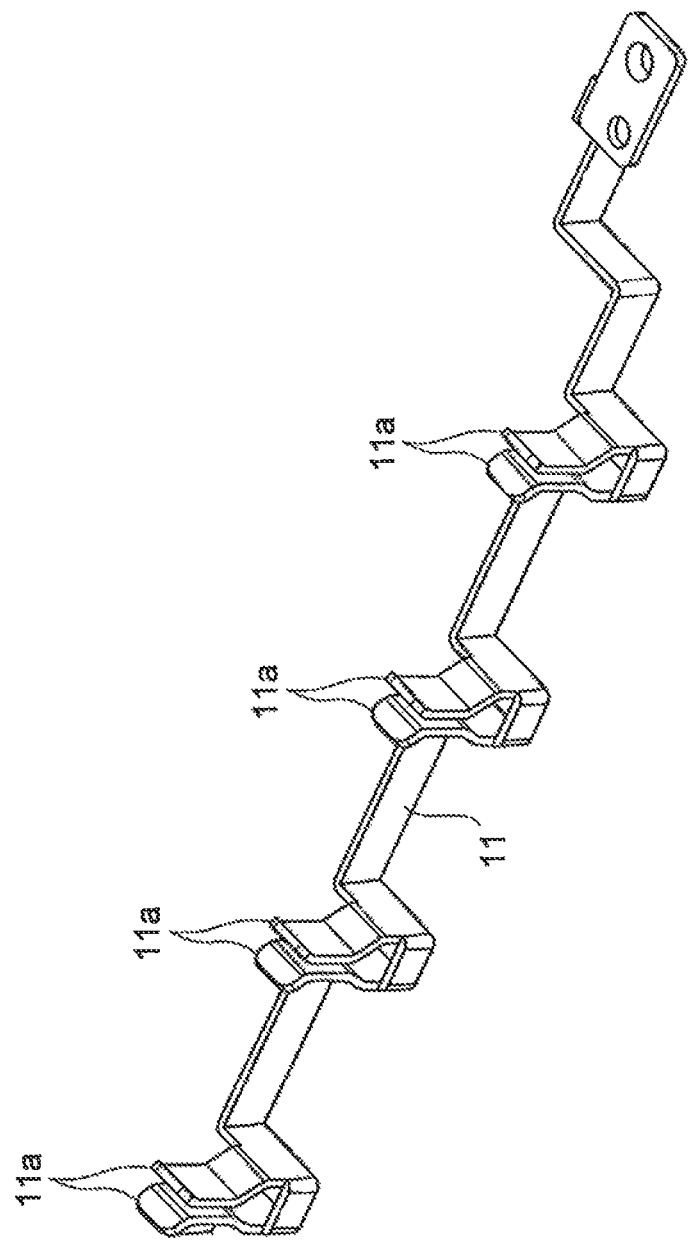
FIG. 26 is a perspective view of a first bus bar according to the sixth embodiment.
Figure 27:
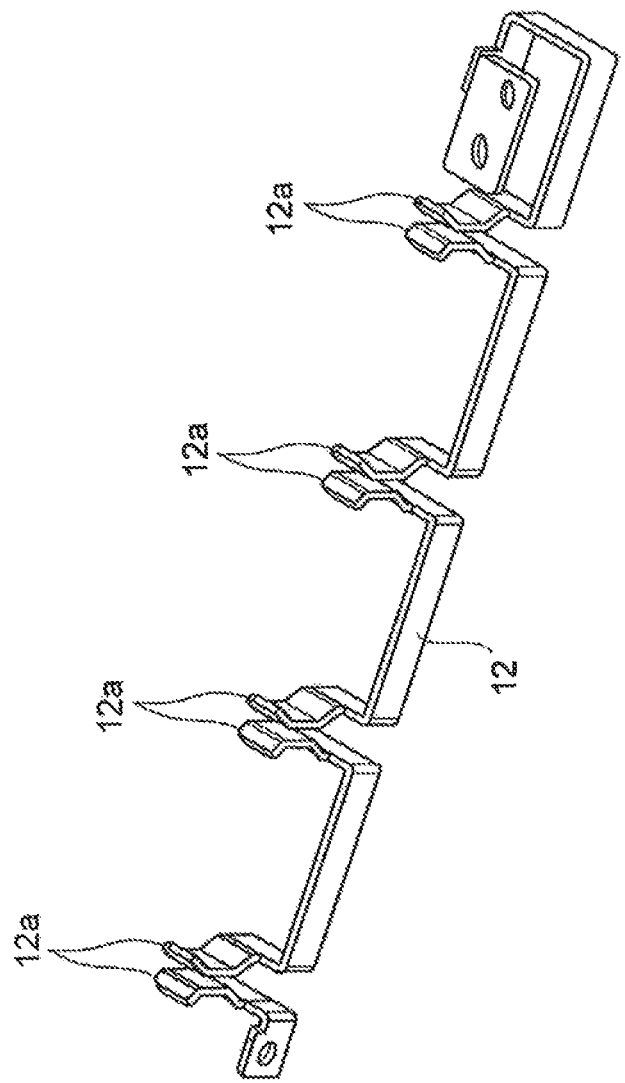
FIG. 27 is a perspective view of a second bus bar according to the sixth embodiment.
Figure 28:
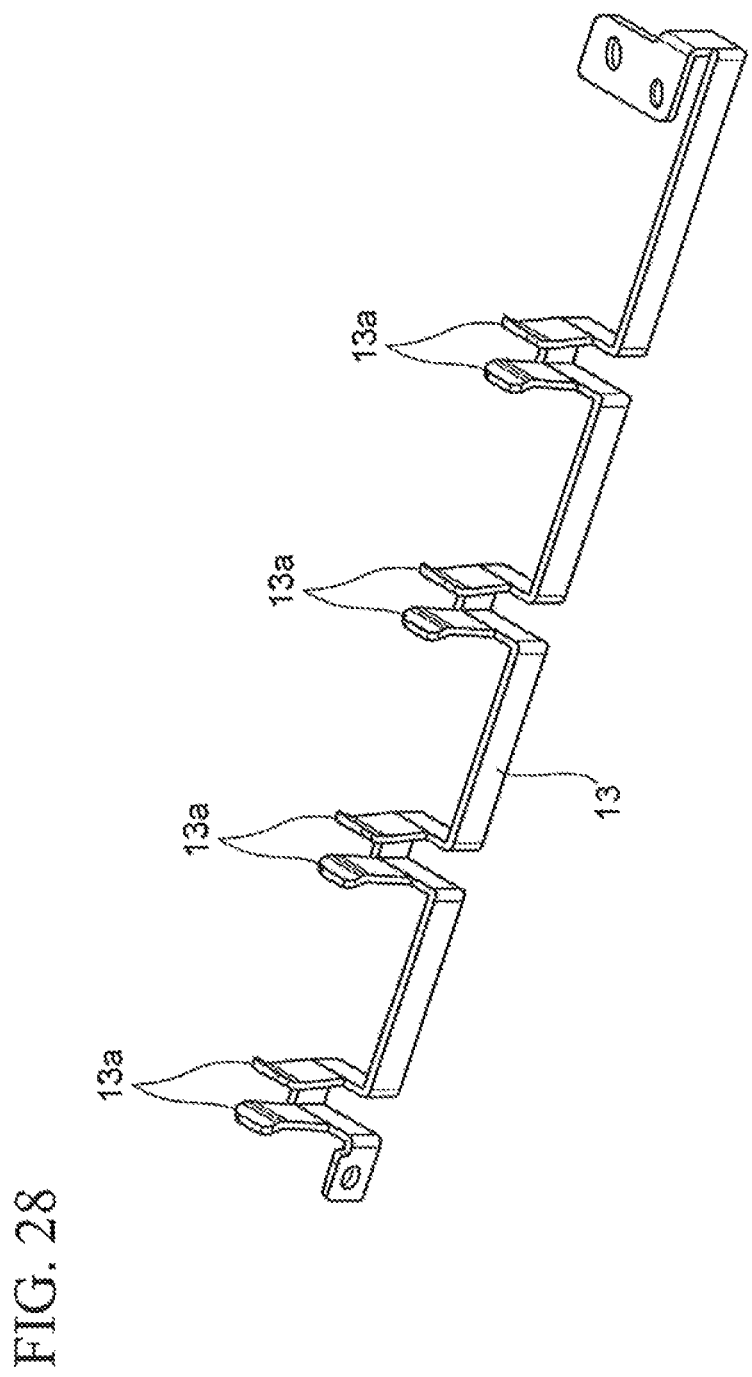
FIG. 28 is a perspective view of a third bus bar according to the sixth embodiment.

FIGS. 26 to 28 are perspective views of the first to third bus bars 11 to 13 which are obtained by bending the conductive plate 55.

As illustrated in FIGS. 26 to 28, the above-described plurality of protrusions 55a becomes first to third contacts 11a to 13a which are integrally provided with the respective first to third bus bars 11 to 13 by the bending process.

Figure 29:
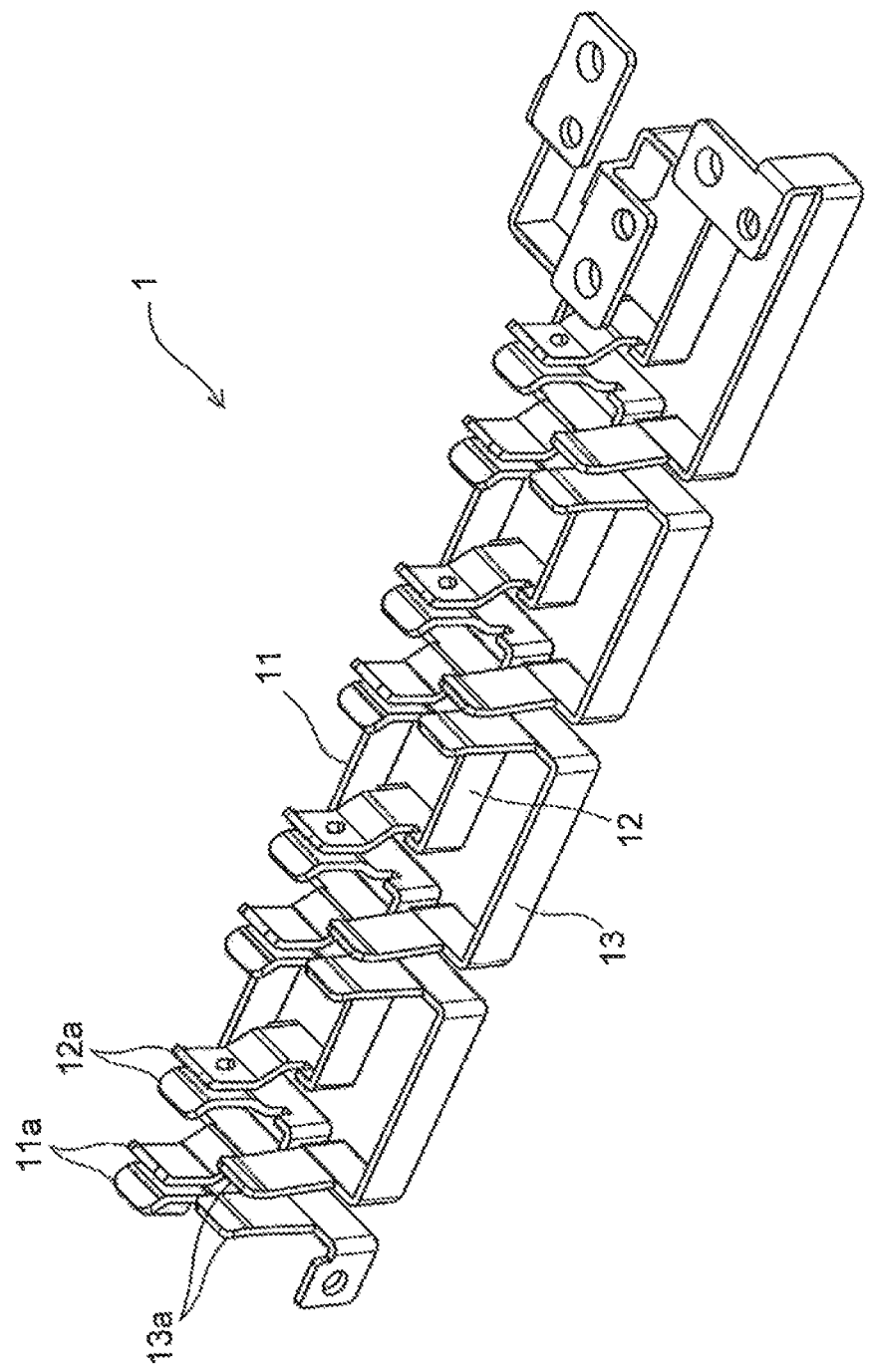
FIG. 29 is a perspective view illustrating an arrangement of the first to third bus bars in the sixth embodiment.

FIG. 29 is a perspective view illustrating an arrangement of the first to third bus bars 11 to 13 which are manufactured as described above in a power strip 1.

As described above, in this embodiment, the first to third bus bars 11 to 13 can easily be manufactured by changing bending portions and bending directions in the conductive plate 55 having the same planar shape. Thus, the costs of manufacturing the bus bars 11 to 13 can be made low.

Seventh Embodiment

This embodiment describes an electrical power measurement system which is useful in a place where many users consume power, such as in an office or a business establishment.

Figure 30:
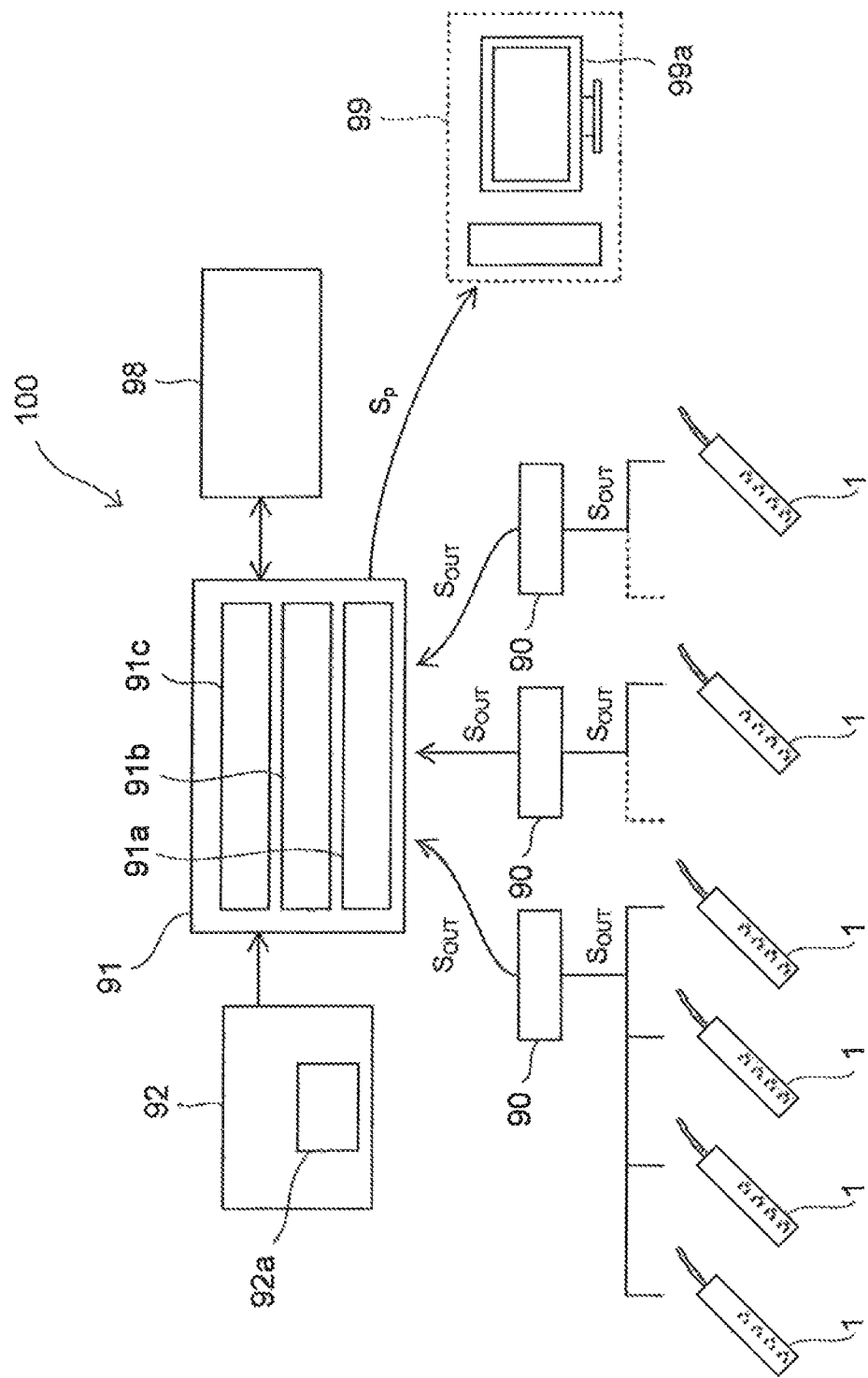
FIG. 30 is a schematic diagram of an electrical power measurement system according to a seventh embodiment.

FIG. 30 is a schematic diagram of the electrical power measurement system according to this embodiment.

An electrical power measurement system 100 has a plurality of the power strips 1 described in the first embodiment, repeaters 90, a data collecting server 91, a management server 92, and a building management system 98.

The repeater 90 aggregates output signals $S_{out}$ which are output from the power strips 1. Then, the repeater 90 performs an IP (Internet Protocol) conversion on the signals $S_{out}$, and outputs them to the data collecting server 91.

The data collecting server 91 includes a collection unit 91a, an operation-power consumption integration unit 91b, and a visualizing processing unit 91c.

Among them, the collection unit 91a has a function as an input unit to receive the output signal $S_{out}$.

The operation-power consumption integration unit 91b refers to a schedule database 92a which is stored in the management server 92. The schedule database 92a stores schedules of users, and stores, for example, absent time of the users in the office.

The operation-power consumption integration unit 91b grasps the absent time of a user by referring to the schedule database 92a. Furthermore, the operation-power consumption integration unit 91b grasps the power consumption of the power strip 1 which is being consumed by the user, based on the output signal $S_{out}$. Then, the operation-power consumption integration unit 91b determines whether power is wasted when the user is absent.

The visualizing processing unit 91c creates image data $S_p$ to visualize the determination of the operation-power consumption integration unit 91b.

The image data $S_p$ is taken by a personal computer 99 of each user or an administrator through a LAN cable or the like. Then, the administrator can grasp how much power is totally wasted in the office when the users are absent by monitoring a monitor 99a.

Note that the building management system 98 may refer to the data collection server 91. In this case, when the operation-power consumption integration unit 91b finds that power is wastefully consumed in the power strip 1 when the user is absent, it is preferable that the building management system 98 automatically lower power for lighting or air conditioning.

According to this embodiment, the power consumptions of the power strips 1 used by a number of users can be accumulated in the data collection server 91. When the unit of the accumulation is per day, per month, per power strip 1, and per electrical device, the power consumptions can be compared in various ways. Thus, further information for deciding whether to reduce the power consumption in an office or the like where a number of users gather can be provided from various aspects.

Eighth Embodiment

Figure 31:
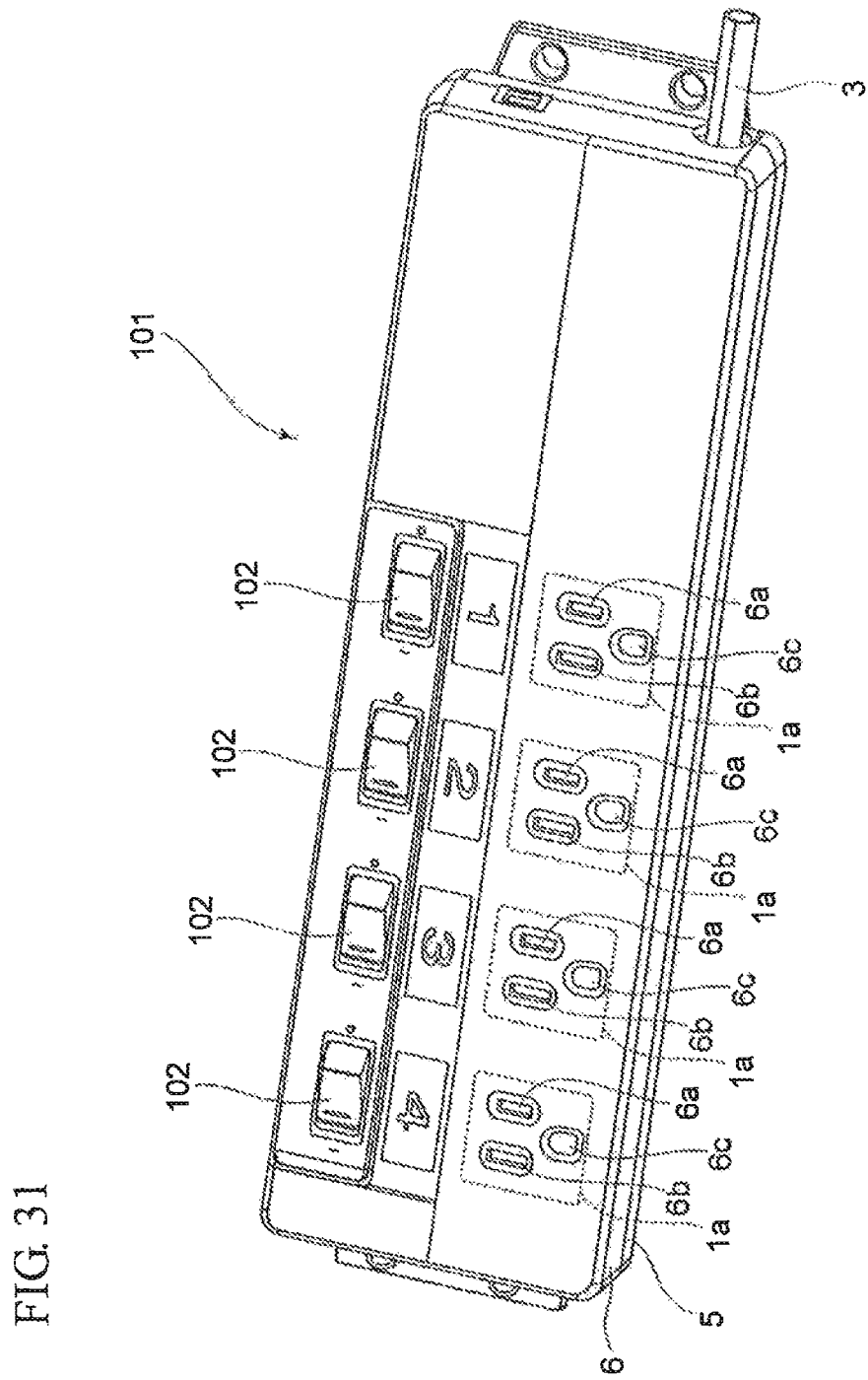
FIG. 31 is an external view of a power strip according to an eighth embodiment.

FIG. 31 is an external view of a power strip 101 according to this embodiment. Note that in FIG. 31, elements same as those described in the first embodiment are denoted with the same reference numerals and the description thereof is omitted below.

As illustrated in FIG. 31, a switch 102 is provided for each of a plurality of the plug insertion portions 1a in the power strip 101.

Figure 32:
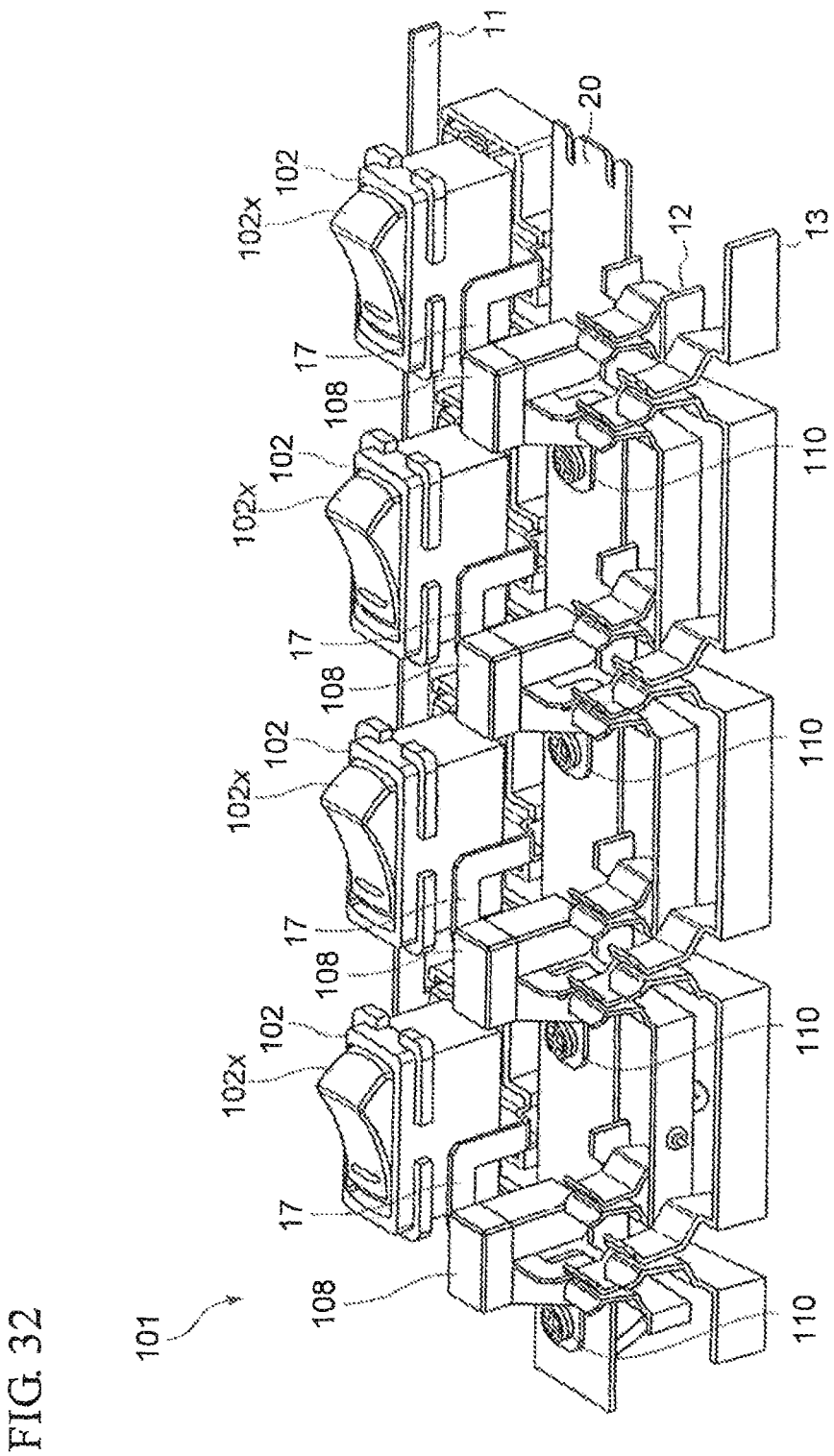
FIG. 32 is a perspective view of the power strip without a lower casing and an upper casing, according to the eighth embodiment.

FIG. 32 is a perspective view of the power strip 101 without the lower casing 5 and the upper casing 6.

Each switch 102 is a rocker switch. When a user presses a button 102x to an ON or Off side, each branch bar 17 can be electrically connected with a second bus bar 12 or electrically disconnected from the second bus bar 12.

Also, a cover 108 to house the magnetic cores is fixed onto the first circuit board 20 by screws 110.

Figure 33:
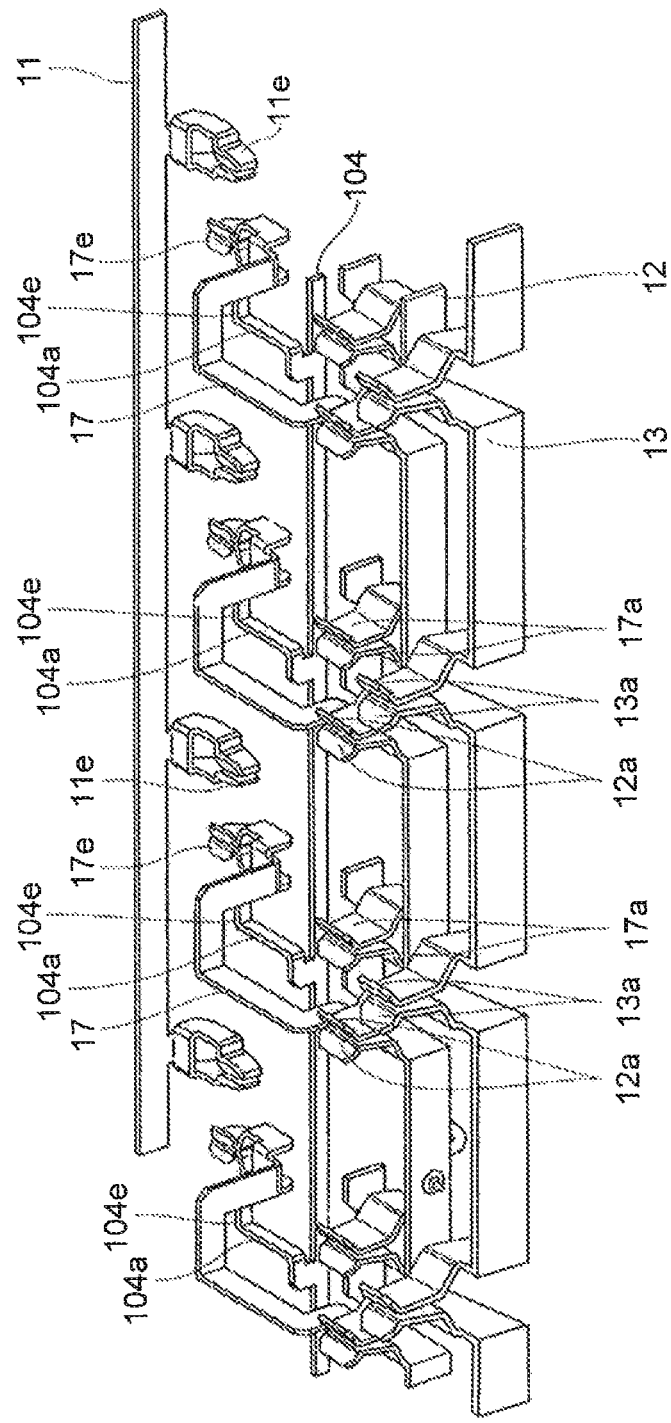
FIG. 33 is a perspective view of the configuration of FIG. 32 without a first circuit board, a switch, and a cover.

FIG. 33 is a perspective view in the state where the first circuit board 20, the switches 102, and the cover 108 are removed from the configuration of FIG. 32.

Note that in FIG. 33, elements same as those described in the first embodiment are denoted with the same reference numerals and the description thereof is omitted below.

As illustrated in FIG. 33, in this embodiment, a fourth contact 11e is provided in the first bus bar 11 and a fifth contact 17e is provided to an end of the branch bar 17.

Furthermore, in addition to the first to third bus bars 11 to 13, an auxiliary bar 104 is provided for supplying power to a light source such as an LED which is built in each switch 102.

The auxiliary bar 104 is manufactured by die cutting and bending a metal plate such as a brass plate, and has a plurality of branches 104a respectively corresponding to the switches 102. A sixth contact 104e, which is bent from the extending direction of the branch 104a to the vertical direction thereof, is formed at the end portion of the branch 104a.

Figure 34:
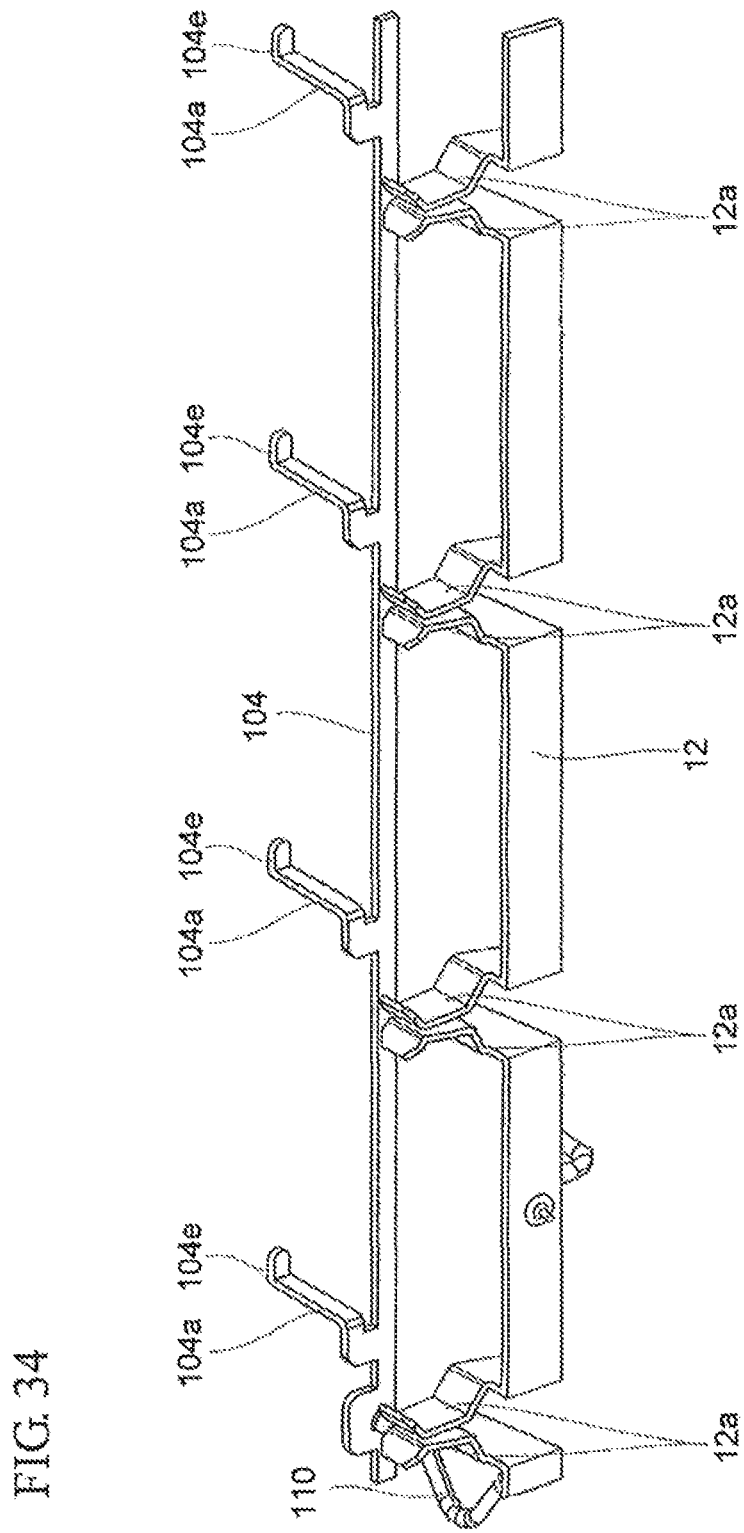
FIG. 34 is a perspective view of a second bus bar and an auxiliary bar according to the eighth embodiment.

FIG. 34 is a perspective view of the second bus bar 12 and the auxiliary bar 104.

As illustrated in FIG. 34, the second bus bar 12 and the auxiliary bar 104 are electrically connected with each other via a connection cable 110 and have the same electrical potential.

Figure 35:
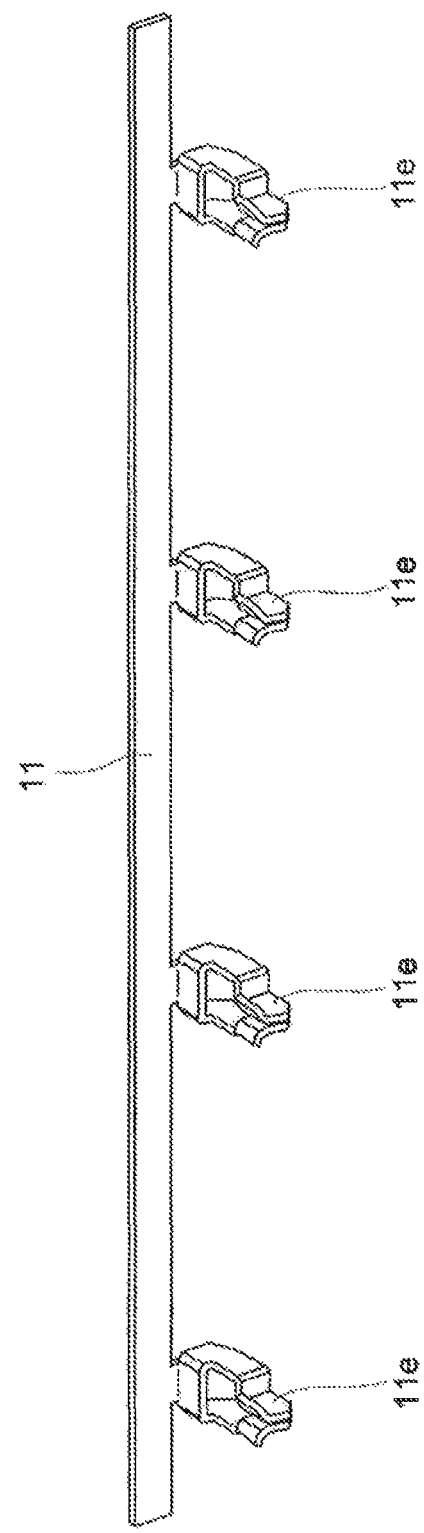
FIG. 35 is a perspective view of a first bus bar according to the eighth embodiment.
Figure 36:
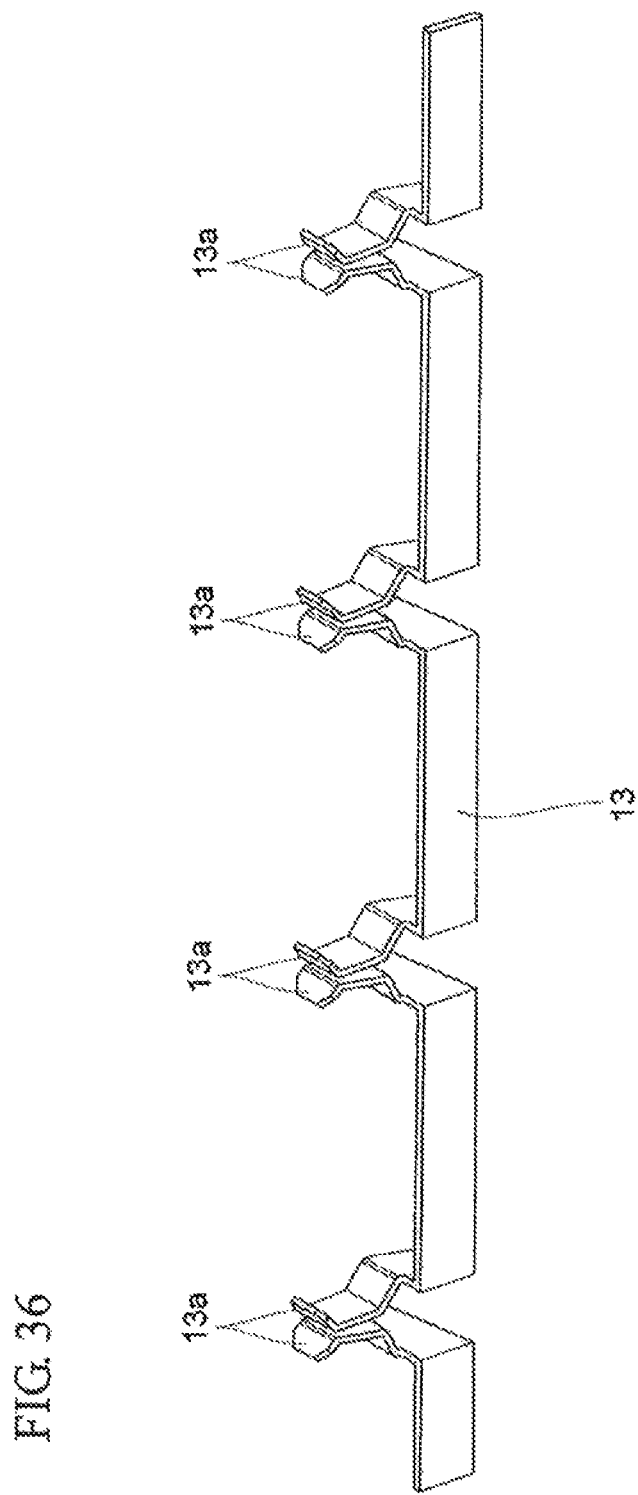
FIG. 36 is a perspective view of a third bus bar according to the eighth embodiment.

On the other hand, FIG. 35 is a perspective view of the first bus bar 11 and FIG. 36 is a perspective view of the third bus bar 13.

These bus bars 11 and 13 may also be manufactured by die cutting and bending a metal plate such as a brass plate.

Figure 37:
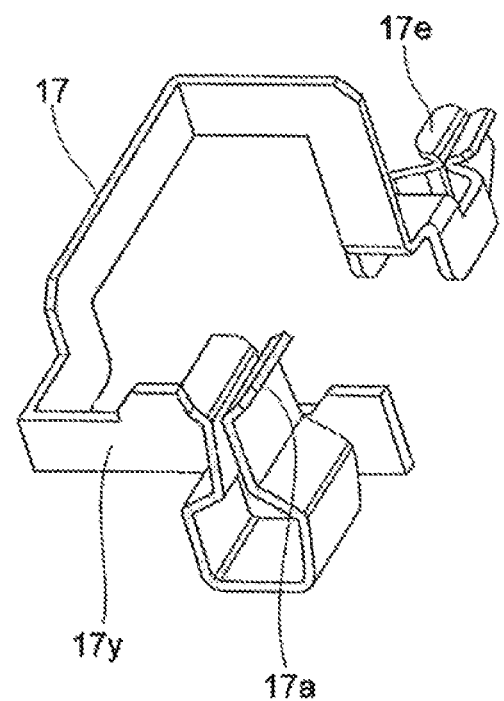
FIG. 37 is a perspective view of a branch bar according to the eighth embodiment.

Also, FIG. 37 is a perspective view of the branch bar 17 according to this embodiment.

As illustrated in FIG. 37, an extending portion 17y of the second contact 17a is provided in the end portion of the branch bar 17.

Figure 38:
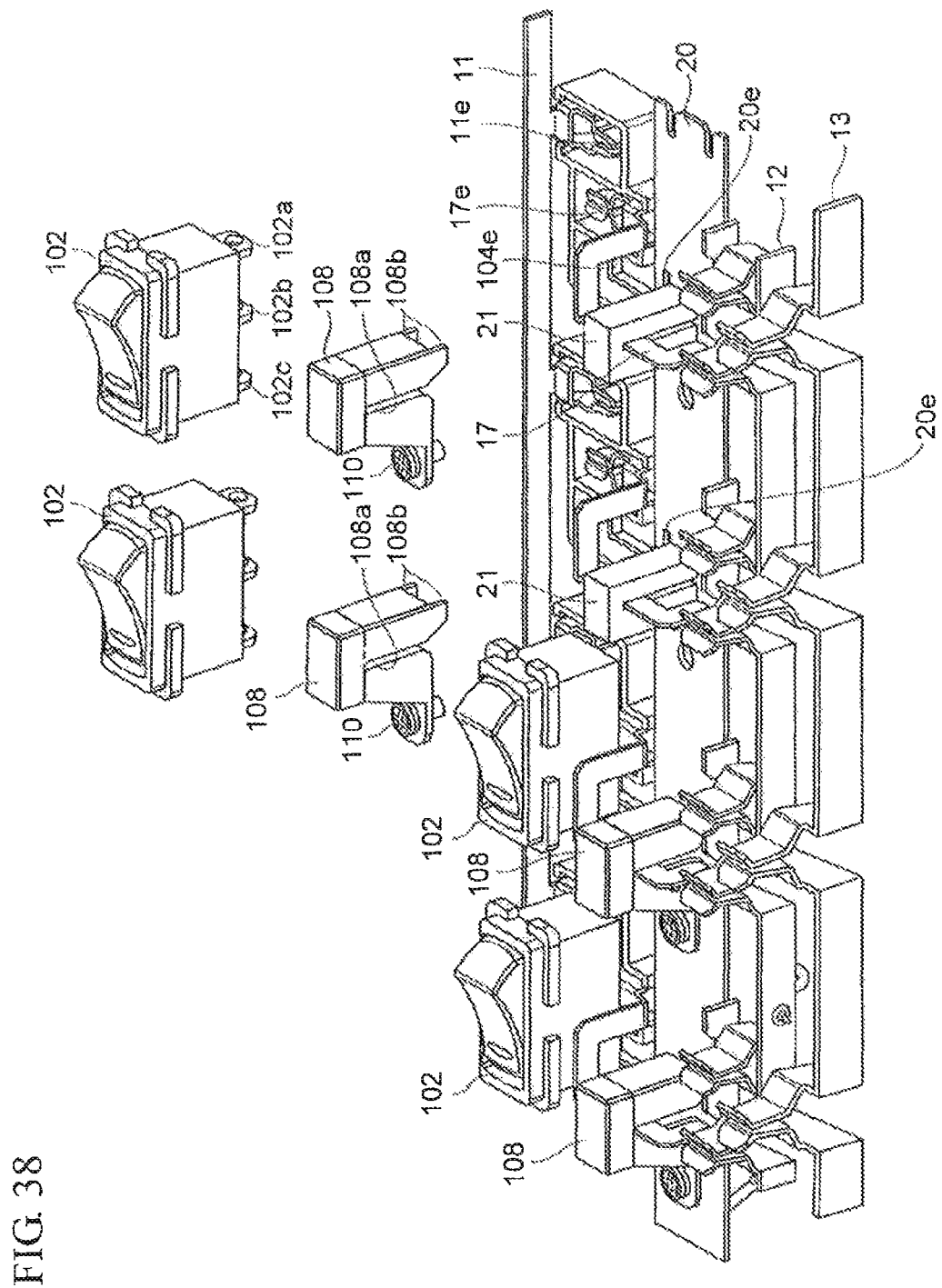
FIG. 38 is an exploded perspective view of the power strip according to the eighth embodiment.

FIG. 38 is an exploded perspective view of the power strip 101.

As illustrated in FIG. 38, the cover 108 is large enough to house the magnetic cores 21, and includes a slit 108 into which the branch bar 17 is inserted.

Furthermore, two fitting protrusions 108b are provided on the bottom portion of the cover 108. The fitting protrusions 108b fit in the fitting holes 20e provided in the first circuit board 20, thereby the cover 108 and the first circuit board 20 are aligned.

The cover 108 is provided for each magnetic core 21 and the cover 108 is fixed on the first circuit board 20 via screws as described above. Thus, the stability of the magnetic cores 21 on the first circuit board 20 is improved.

On the other hand, first to third terminals 102a to 102c are provided in the switch 102. These terminals 102a to 102c respectively fit to the fourth contact 11e, the fifth contact 17e, and the sixth contact 104e.

FIG. 39 is a circuit diagram of the power strip 101 including the switch 102. Note that in FIG. 39, the third bus bar 13 serving as an earth line is omitted.

As illustrated in FIG. 39, each switch 102 has a light source 120 and two conductive blades 118. These conductive blades 118 are mechanically connected to the button 102x (see FIG. 32). When the switch 102 is turned on by operating the button 102x, the branch bar 17 and the branch 104a are simultaneously electrically connected to the first bus bar 11.

The light source 120 emits light in the On-state to entirely illuminate the translucent button 102x (see FIG. 32) with the light. Accordingly, a user can see that the switch 102 is in the On-state.

Note that the power strip 101 according to this embodiment also has a transmission circuit unit 27 with the same circuit configuration as that of FIG. 15 and can perform a method of measuring electrical power same as that of the first embodiment.

According to this embodiment, as illustrated in FIG. 31, the switch 102 is provided in each of plug insertion portions 1a. With this configuration, in the case where an electrical device being connected to the plug insertion portion 1a is unused, the power which is supplied from the plug insertion portion 1a to the electrical device is cut off by turning off the switch corresponding to the plug insertion portion 1a. Accordingly, the standby electricity of the electrical device can be cut.

Furthermore, as illustrated in FIG. 38, the magnetic cores 21 are housed in the cover 108, and the cover 108 is fixed on the first circuit board 20. Accordingly, the magnetic cores 21 are less likely to be misaligned on the circuit board. Thus, the stability of mounting the magnetic cores 21 on the circuit board 20 is improved.

Although the embodiments are described in detail, the embodiments are not limited to the above.

For example, the description is given of the case where a plurality of plug insertion portions 1a is provided in the power strips 1 and 101 in FIG. 1 and FIG. 31. However, only one plug insertion portion 1a may be provided in the power strips 1 and 101.

All examples and conditional language provided herein are intended for the pedagogical purpose of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention has been described in detail, it should be understood that the various changes, substitutions, and alterations could be made hereto without departing from the spirit and scope of the invention.

What is claimed is:

1. A power strip comprising:
a casing which includes a plurality of plug insertion portions each having a first insertion port and a second insertion port into which first plug blade and second plug blade of a socket plug are to be respectively inserted;
a magnetic core which is provided to correspond with each of the plurality of plug insertion portions and includes a first opening into which the first plug blade is to be inserted, a second opening into which the second plug blade is to be inserted, and a slit by which the first opening and the second opening communicate; and
a magnetic sensor provided in the slit.

2. The power strip according to claim 1, wherein
the first opening has a rectangular shape which extends in a first direction in a plan view,
the second opening has a rectangular shape which extends in a second direction parallel to the first direction in the plan view, and
the slit has a rectangular shape which extends in a third direction perpendicular to each of the first direction and the second direction in the plan view.

3. The power strip according to claim 1, wherein a width of the slit is narrower than a width of each of the first plug blade and the second plug blade.

4. The power strip according to claim 1, wherein a combined shape of the first opening, the second opening, and the slit is an H shape in the plan view.

5. The power strip according claim 1, wherein a normal direction of a magnetic-sensing surface of the magnetic sensor is perpendicular to a depth direction of the first opening and the second opening.

6. The power strip according to claim 1, wherein a normal direction of a magnetic-sensing surface of the magnetic sensor is perpendicular to an extending direction of each of the first plug blade and the second plug blade.

7. The power strip according to claim 1, further comprising a circuit board fixed on an inner surface of the casing, wherein
the magnetic core is provided between the inner surface of the casing and the circuit board and is fixed on the casing by pressing force applied from the circuit board.

8. The power strip according to claim 7, wherein the magnetic sensor is fixed on the circuit board.

9. The power strip according to claim 7, wherein a first hole into which the first plug blade is to be inserted and a second hole into which the second plug blade is to be inserted are formed in the circuit board.

10. The power strip according to claim 7, wherein
a rib is provided to stand on an inner surface of the casing, and
the magnetic core is clamped by the rib.

11. The power strip according to claim 10, wherein
an outer shape of the magnetic core is rectangular, and
a plurality of the ribs are provided, and the magnetic core is clamped by the ribs from diagonal directions of the magnetic core.

12. The power strip according to claim 10, wherein the rib is an L-shaped rib.

13. The power strip according to claim 12, wherein a third hole in which the L-shaped rib fits is formed in the circuit board.

14. The power strip according to claim 10, further comprising:
an extended portion provided at the rib; and
a claw provided at an end of the extended portion, wherein
a third hole into which the extended portion is inserted is formed in the circuit board, so that a principal surface of the circuit board is held by the claw.

15. The power strip according to claim 1, further comprising a calculating unit, where the calculating unit respectively calculating power consumptions of a plurality of electrical devices connected to the plug insertion portions, the power being individually calculated for each of the electrical devices by measuring a current flowing through the first plug blade and second plug blade using the magnetic sensor, and by multiplying the current by a power-supply voltage.

16. The power strip according to claim 1, further comprising:
a first bus bar electrically connected to one pole of a power source;
a plurality of first contacts which is integrally provided to the first bus bar and receives the first plug blade;
a second bus bar electrically connected to the other pole of the power supply; and
a plurality of second contacts which is integrally provided to the second bus bar and receives the second plug blade, wherein
the first bus bar and the second bus bar are each manufactured by bending conductive plates each having a same planar shape.

17. The power strip according to claim 15, wherein
the plug insertion portion includes a third insertion port into which an earth terminal of the socket plug is to be inserted,
the power strip further comprises a third bus bar which is kept at a ground potential and includes a plurality of third contacts, and
the first bus bar, the second bus bar, and the third bus bar are each manufactured by bending conductive plates each having a same planar shape.

18. An electrical power measurement system comprising:
a power strip including a plurality of plug insertion portions into which socket plugs of external electrical devices are to be respectively inserted, the power strip supplying a power-supply voltage to each of the plug insertion portions;
a magnetic core provided in each of the plug insertion portions and having a slit;
a magnetic sensor provided in the slit and measures a current flowing through a first plug blade and a second plug blade of the socket plug; and
a computer for calculating power consumptions of a plurality of electrical devices connected to the plug insertion portions, the power being calculated for each of the electrical devices by multiplying the measured current by the power-supply voltage, wherein
the magnetic core has a first opening into which the first plug blade is to be inserted and a second opening into which the second plug blade is to be inserted, and the first opening and the second opening are communicating by the slit.

19. The electrical power measurement system according to claim 18, wherein a combined shape of the first opening, the second opening, and the slit is an H shape in a plan view.

20. The electrical power measurement system according to claim 18, wherein the computer has a memory.

21. The electrical power measurement system according to claim 18, wherein the magnetic sensor includes a gallium-arsenide-based magnetic sensing unit and a differential amplifier.

* * * * *